US008771538B2

(12) United States Patent
Lubomirsky et al.

(10) Patent No.: US 8,771,538 B2
(45) Date of Patent: Jul. 8, 2014

(54) PLASMA SOURCE DESIGN

(75) Inventors: Dmitry Lubomirsky, Cupertino, CA (US); Jang-Gyoo Yang, San Jose, CA (US); Matthew Miller, Newark, CA (US); Jay Pinson, San Jose, NM (US); Kien Chuc, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 728 days.

(21) Appl. No.: 12/949,661

(22) Filed: Nov. 18, 2010

(65) Prior Publication Data

US 2011/0114601 A1 May 19, 2011

Related U.S. Application Data

(63) Continuation-in-part of application No. 12/905,940, filed on Oct. 15, 2010.

(60) Provisional application No. 61/262,505, filed on Nov. 18, 2009.

(51) Int. Cl.
*B44C 1/22* (2006.01)
*H01J 37/32* (2006.01)

(52) U.S. Cl.
CPC ....... *H01J 37/32357* (2013.01); *H01J 37/3211* (2013.01)
USPC ............ 216/68; 315/111.41; 315/111.21; 315/111.51; 156/345.48; 156/345.24; 156/345.38; 216/67; 216/63; 216/64; 216/66

(58) Field of Classification Search
USPC ............ 315/111.01, 111.21, 111.41, 111.71; 216/63, 67, 68
See application file for complete search history.

(56) References Cited

U.S. PATENT DOCUMENTS 3,509,490 A 4/1970 Zarowin
4,368,092 A 1/1983 Steinberg et al.
(Continued)

FOREIGN PATENT DOCUMENTS

| JP | 06-224155 A | 8/1994 |
| KR | 10-2008-0067042 | 7/2008 |
| KR | 10-2009-0015158 | 2/2009 |
| KR | 1020100006720 | * 10/2010 |

OTHER PUBLICATIONS

International Search Report and Written Opinion dated Jul. 19, 2011 for International Application No. PCT/US2010/057274.

(Continued)

*Primary Examiner* — Douglas W Owens
*Assistant Examiner* — Srinivas Sathiraju
(74) *Attorney, Agent, or Firm* — Patterson & Sheridan, LLP

(57) ABSTRACT

Embodiments of the present invention generally provide a plasma source apparatus, and method of using the same, that is able to generate radicals and/or gas ions in a plasma generation region that is symmetrically positioned around a magnetic core element by use of an electromagnetic energy source. In general, the orientation and shape of the plasma generation region and magnetic core allows for the effective and uniform coupling of the delivered electromagnetic energy to a gas disposed in the plasma generation region. In general, the improved characteristics of the plasma formed in the plasma generation region is able to improve deposition, etching and/or cleaning processes performed on a substrate or a portion of a processing chamber that is disposed downstream of the plasma generation region.

5 Claims, 15 Drawing Sheets

(56) References Cited

U.S. PATENT DOCUMENTS

| | | | |
|---|---|---|---|
| 4,431,898 A | | 2/1984 | Reinberg et al. |
| 4,507,598 A | * | 3/1985 | Wakabayashi et al. ....... 318/687 |
| 4,906,811 A | * | 3/1990 | Buil .......................... 219/121.59 |
| 5,106,827 A | | 4/1992 | Borden et al. |
| 5,197,818 A | * | 3/1993 | Johnson ........................ 403/217 |
| 5,290,382 A | | 3/1994 | Zarowin et al. |
| 5,942,854 A | * | 8/1999 | Ryoji et al. ............... 315/111.21 |
| 5,969,470 A | * | 10/1999 | Druz et al. .................. 313/359.1 |
| 5,998,933 A | | 12/1999 | Shunko |
| 6,110,287 A | | 8/2000 | Arai et al. |
| 6,150,628 A | | 11/2000 | Smith et al. |
| 6,184,489 B1 | | 2/2001 | Ito et al. |
| 6,204,607 B1 | * | 3/2001 | Ellingboe ................ 315/111.51 |
| 6,214,162 B1 | | 4/2001 | Koshimizu |
| 6,388,226 B1 | * | 5/2002 | Smith et al. .............. 219/121.57 |
| 6,453,842 B1 | | 9/2002 | Hanawa et al. |
| 6,471,822 B1 | | 10/2002 | Yin et al. |
| 6,486,431 B1 | | 11/2002 | Smith et al. |
| 6,494,986 B1 | | 12/2002 | Hanawa et al. |
| 6,552,296 B2 | | 4/2003 | Smith et al. |
| 6,559,408 B2 | | 5/2003 | Smith et al. |
| 6,592,709 B1 | * | 7/2003 | Lubomirsky ............. 156/345.48 |
| 6,664,497 B2 | | 12/2003 | Smith et al. |
| 6,712,020 B2 | | 3/2004 | Cox et al. |
| 6,755,150 B2 | | 6/2004 | Lai et al. |
| 6,815,633 B1 | | 11/2004 | Chen et al. |
| 6,815,899 B2 | * | 11/2004 | Choi ......................... 315/111.21 |
| 6,924,455 B1 | | 8/2005 | Chen et al. |
| 7,137,354 B2 | * | 11/2006 | Collins et al. ............ 118/723 IR |
| 7,161,112 B2 | | 1/2007 | Smith et al. |
| 7,166,816 B1 | | 1/2007 | Chen et al. |
| 7,217,337 B2 | * | 5/2007 | Choi ......................... 156/345.38 |
| 7,255,774 B2 | * | 8/2007 | Vukovic et al. .......... 156/345.48 |
| 7,274,281 B2 | * | 9/2007 | Sugioka ........................ 336/170 |
| 7,320,941 B2 | * | 1/2008 | Nishida et al. ................ 438/707 |
| 7,405,410 B2 | * | 7/2008 | Morehouse ............ 250/396 ML |
| 7,501,600 B2 | | 3/2009 | Holber et al. |
| 7,541,558 B2 | | 6/2009 | Smith et al. |
| 7,569,790 B2 | | 8/2009 | Holber et al. |
| 7,659,489 B2 | | 2/2010 | Holber et al. |
| 7,837,826 B2 | * | 11/2010 | Marakhtanov et al. .. 156/345.48 |
| 7,952,048 B2 | | 5/2011 | Choi et al. |
| 2002/0046991 A1 | | 4/2002 | Smith et al. |
| 2002/0125213 A1 | | 9/2002 | Yamazaki et al. |
| 2002/0125225 A1 | | 9/2002 | Smith et al. |
| 2002/0125226 A1 | | 9/2002 | Smith et al. |
| 2003/0015965 A1 | | 1/2003 | Godyak |
| 2004/0079287 A1 | | 4/2004 | Smith et al. |
| 2006/0086699 A1 | | 4/2006 | Holber et al. |
| 2007/0145018 A1 | | 6/2007 | Smith et al. |
| 2008/0020574 A1 | * | 1/2008 | Marakhtanov et al. ....... 438/689 |
| 2009/0288772 A1 | | 11/2009 | Holber et al. |
| 2010/0001796 A1 | | 1/2010 | Sivakumar et al. |

OTHER PUBLICATIONS

Jang-Gyoo Yang, "Start-Up Study of Plasma in the Kaist Tokamak," Department of Physics Korea Advanced Institute of Science and Technology, 1994. 157 pages.

International Search Report and Written Opinion dated Jul. 13, 2011 for PCT International Application No. PCT/US2010/055077.

Supplemental Notice of Allowability and Examiner-Initiated Interview Summary dated May 16, 2013.

Non-Final Office Action dated Nov. 28, 2012 for U.S. Appl. No. 12/905,940.

* cited by examiner

PLASMA SOURCE DESIGN

CROSS-REFERENCE TO RELATED APPLICATIONS

This application is a continuation-in-part of U.S. patent application Ser. No. 12/905,940, filed Oct. 15, 2010, and also claims the benefit of U.S. Provisional Patent Application Ser. No. 61/262,505, filed Nov. 18, 2009, which are both herein incorporated by reference.

BACKGROUND OF THE INVENTION

1. Field of the Invention

Embodiments of the invention generally relate to plasma processing systems and materials and apparatus for controlling plasma uniformity in plasma processing systems.

2. Description of the Related Art

Plasma processing chambers are regularly utilized in various electronic device fabrication processes, such as etching processes, chemical vapor deposition (CVD) processes, and other processes related to the manufacture of electronic devices on substrates. Many ways have been employed to generate and/or control the plasma density, shape, and electrical characteristics in processing chambers, such as capacitively or inductively coupled RF sources commonly used in conventional plasma chambers. For example, during a plasma assisted chemical vapor deposition process, processing gases are introduced into a processing chamber through a capacitively coupled showerhead that is disposed over a semiconductor substrate that is circumscribed by a process kit. Once a plasma is formed in a PECVD chamber, the plasma and process gas(es) interact with the substrate to deposit a desired material layer thereon.

Conventional plasma processing chamber designs in which the generated plasma is disposed over the substrate surface can cause unwanted sputtering and damage to the substrate surface due to the interaction of electrons and ions formed in the plasma with the substrate surface. Floating and electrically grounded components that are exposed to the generated plasma will generally accumulate a net charge. The formed net charge causes electrons and/or ions formed in the plasma to bombard and possibly damage the exposed surfaces of the substrate or chamber component. Thus, in some applications it is desirable to form gas radicals that have sufficient energy to easily react with the substrate surface, or surface of the chamber component, to enhance the reaction rate, while not energetically bombarding the surface of the substrate or chamber component, since the non-ionized gas radical is not affected by charge formed on the substrate or component surface.

Therefore, to prevent or minimize the plasma interaction with the substrate and chamber components, remote plasma source (RPS) designs have been used. Typical remote plasma source designs include a plasma generation region that is remotely positioned from the processing region of the processing chamber in which a substrate is positioned. In this way the plasma generated in the plasma generation region of the RPS device will generally not interact with the substrate surface.

However, current conventional RPS designs typically utilize microwave, capacitively coupled or inductively coupled energy sources that have a narrow plasma generating region, which will cause these devices to have a smaller than desirable plasma processing window that limits the range of energies of the formed gas radicals and gas ion that are formed in the plasma generating region of the conventional RPS device.

In one example, as shown in FIG. 1, which is FIG. 3 in the issued U.S. Pat. No. 6,150,628, a conventional RPS design will generally include region 112, 114 of a metallic plasma chamber 100 in which a plasma is generated by the delivery of energy to a first and a second core 104, 106. One skilled in the art will appreciate that the electromagnetic energy delivered to the region of the conventional RPS design in which the plasma is formed will not be uniform and will have a high activity, or "hot spot," in the regions "PR" (FIG. 1), where the plasma generation device(s) (i.e., coils) are positioned. All of the other portions of the regions 112, 114 will have weak or non-existent power coupling outside of the "PR" regions, due to their distance and position relative the plasma inducing elements (e.g., first and a second cores 104, 106). As schematically illustrated in FIG. 1, conventional RPS designs traditionally use a closed loop RF source configuration that has windings that are wrapped around a closed magnetically permeable core that surrounds a portion of the plasma generating region. The generated fields that are focused by the position and shape of the cores 104, 106 relative to the regions "PR," have a relatively small area and have a very limited time in which to transfer the RF energy to a gas flowing through the conventional RPS device. Thus, conventional RPS designs that have a small plasma generating region have a very limited ability to generate and/or control the energies of the formed gas radicals and/or gas ions.

To resolve the energy coupling efficiency problems, typically, RPS device manufacturers will generally flow both electro-negative type gases (e.g., ammonia ($NH_3$)) and electro-positive type gases (e.g., argon (Ar)) at the same time through the plasma generation region to more easily form and sustain a generated plasma therein. However, in some cases it is desirable to only deliver a single electro-negative or a single electropositive gas to improve the processing speed or plasma processing results. Also, it is often desirable to form and sustain a plasma within regimes that have a low plasma impedance, such as where the pressure in the plasma generation region is low (e.g., <200 mTorr). Conventional RPS designs that inefficiently couple the plasma energy to the processing gasses are not currently able to meet the needs of the semiconductor processing industry. Therefore, there is a need for an RPS design that more effectively couples the delivered RF energy to the processing gases, has a wider process window and is able to work in a wider range of plasma impedances.

Also, it is typical for conventional RPS designs to utilize a switching power supply to form a plasma in the plasma generation region of the RPS device. The use of switching power supplies is preferred in conventional designs, since they do not require a line isolation circuit or an impedance matching network to deliver the energy to the plasma generation region of the RPS device. Switched-mode power supplies regulate the delivered RF energy by either adjusting the output voltage or current in a pulsed or duty cycle type delivery configuration. However, it has been found that the use of a switching power supply in an RPS design is ineffective in efficiently coupling the delivered RF energy to the plasma. Therefore, there is need to more efficiently couple the delivered RF energy to the gases delivered through the RPS device.

Conventional RPS designs also typically use metal components to enclose the plasma generation region in the RPS device. However, to prevent the attack of the metal components by the RPS energized gases, it is typical to deposit a coating on the surfaces that will be exposed to the plasma and energetic gases. Typically, anodized aluminum coatings have been used on aluminum parts to prevent the attack of the base aluminum surface by the highly energetic species generated in the RPS plasma. However, it has been found that significant process result drift will occur when using coatings in the plasma formation region of an RPS device. The process drift can be created by the interaction of the RPS excited gases with the surfaces of the structural metal components through imperfections in the coating, such as coating porosity or cracks. Coating problems can be especially an issue when the plasma contains oxidizing species or fluorinated species that tend to attack most commonly used metal materials. Therefore, there is a need for an RPS design that avoids the process drift and particle formation due to the attack of the elements that contain the plasma generated in an RPS device.

Also, there is a need in the art for an apparatus and process that more effectively generates and controls the plasma uniformity, and has a larger processing window, without significantly increasing the processing or hardware cost.

SUMMARY OF THE INVENTION

Embodiments of the present invention generally provide a plasma source coupled to a processing chamber, comprising a core element having a first end, a second end and a core element central axis, a first plasma block having one or more surfaces that at least partially enclose a first annular shaped plasma generating region, wherein the first annular shaped plasma generating region is disposed around a first portion of the core element, and a coil disposed over a portion of the core element.

Embodiments of the invention may also provide a plasma source coupled to a processing chamber, comprising a core element comprising having a first end, a second end and a core element central axis, a first plasma block having one or more surfaces that at least partially enclose a first annular shaped plasma generating region, wherein the first annular shaped plasma generating region is disposed around a first portion of the core element and has a central axis that is generally coincident with the core element central axis, a second plasma block having one or more surfaces that at least partially enclose a second annular shaped plasma generating region, wherein the second annular shaped plasma generating region is disposed around a second portion of the core element and has a central axis that is generally coincident with the core element central axis, and a coil disposed over a portion of the core element.

Embodiments of the invention may also provide a method of forming energetic gas atoms, comprising flowing a process gas into a first annular shaped plasma generating region that is at least partially enclosed by one or more surfaces of a first plasma block, wherein the first annular shaped plasma generating region is disposed around a portion of a core element, and generating a plasma in the first annular shaped plasma generating region by delivering RF power to a coil wound around a portion of the core element.

In another aspect, a plasma chamber having multiple plasma controlling devices for plasma processing a substrate is provided. Each of multiple plasma controlling devices comprising a plasma block having an inner ring, an outer ring, and a side plate coupling the inner ring and the outer ring to define a plasma generating region between the inner ring and the outer ring, a gas inlet formed through a portion of the outer ring, the gas inlet connecting to a first external gas source, a gas outlet formed through a portion of the outer ring, the gas outlet being in fluid communication with a processing region within the plasma chamber in which a substrate is disposed, and a magnetic permeable core disposed through each inner ring of the plasma block.

Embodiments of the invention may also provide a plasma source coupled to a processing chamber, comprising a core element having a first end, a second end and a core element central axis, a first plasma block having one or more surfaces that at least partially enclose a first annular shaped plasma generating region, wherein the first annular shaped plasma generating region is disposed around a first portion of the core element, a first coil disposed over a first portion of the core element; and a second coil disposed over a second portion of the core element, wherein the first plasma block is disposed between the first portion of the core element and second portion of the core element.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide a plasma source apparatus, and method of using the same, that is able to generate radicals and/or gas ions in a plasma generation region that is symmetrically positioned around a magnetic core element by use of an electromagnetic energy source. In general, the orientation and shape of the plasma generation region and magnetic core allows for the effective and uniform coupling of the delivered electromagnetic energy to a gas disposed in the plasma generation region. It is believed that due to the configuration of the plasma source disclosed herein, the electromagnetic energy delivered to the magnetic core is able to more efficiently form gas radicals and/or gas ions, provide a wider process window in which to form the gas radicals and/or gas ions, and form a broader range of gas radical energies and/or ion densities than conventional plasma source designs found on the market today. In general, the improved characteristics of the plasma formed in the plasma generation region is able to improve deposition, etching and/or cleaning processes performed on a substrate or a portion of a processing chamber that is disposed downstream of the plasma generation region.

Figure 2A:
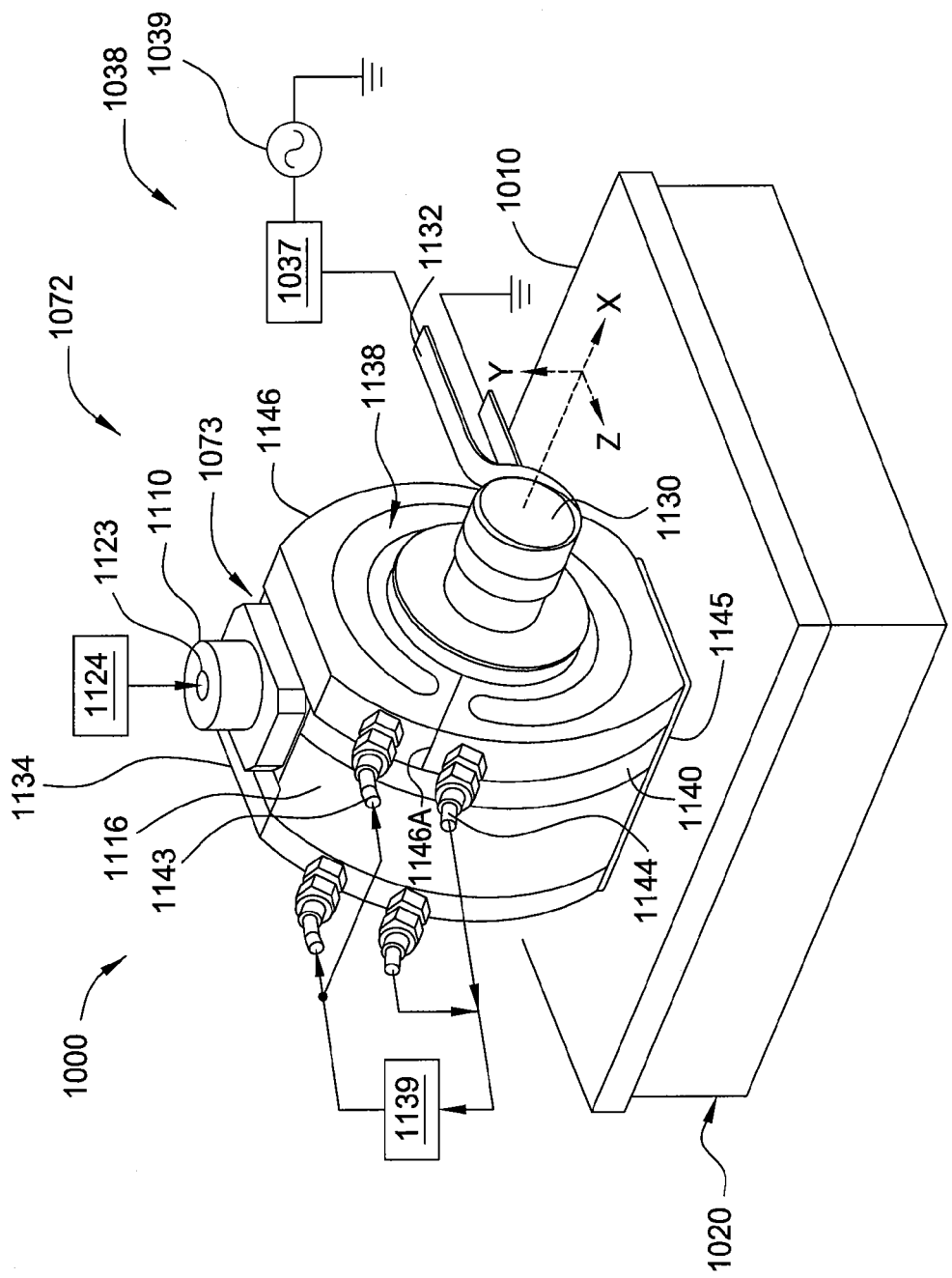
FIG. 2A is an isometric view of a plasma source coupled to a processing chamber according to one embodiment of the present invention.
Figure 2B:
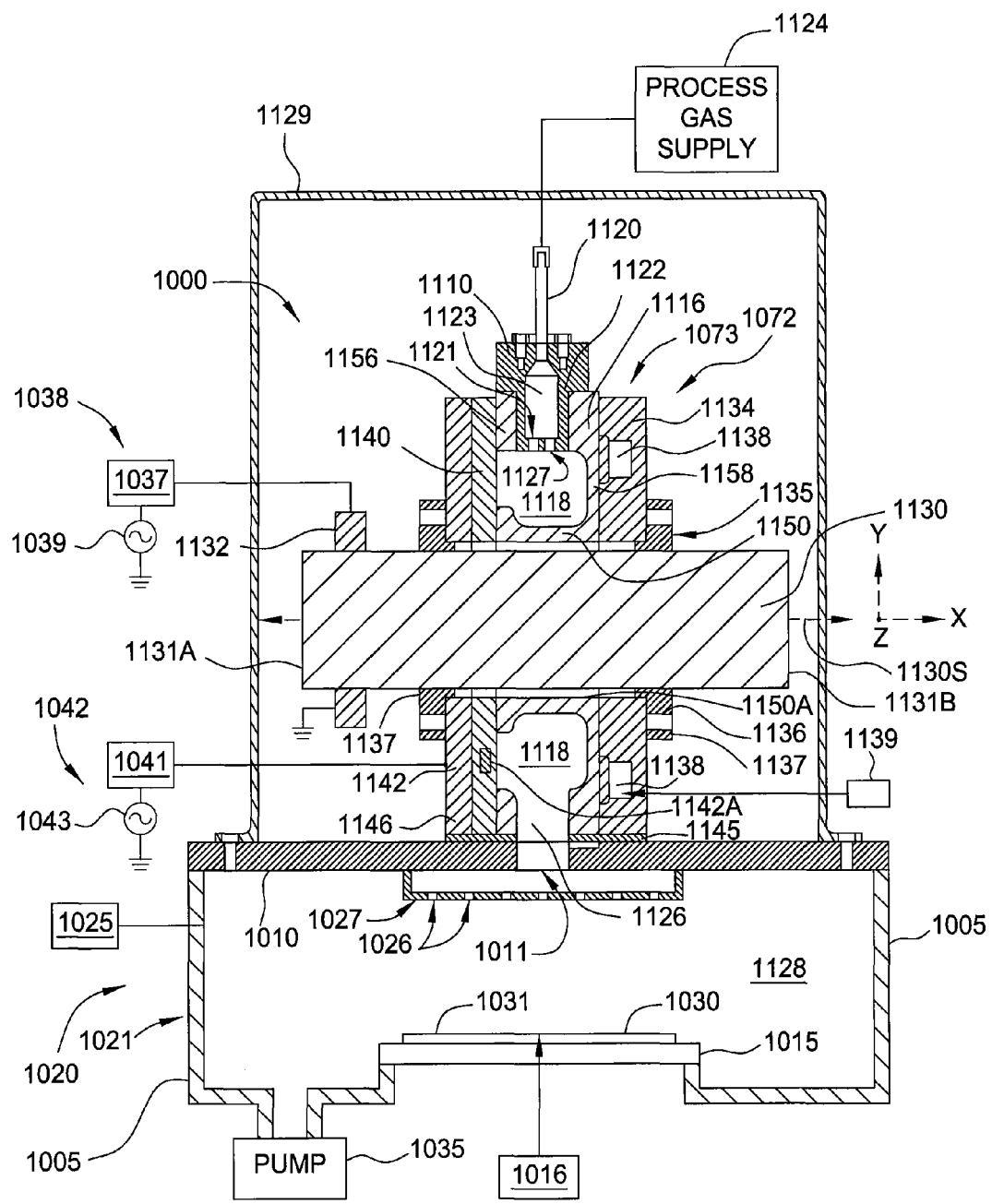
FIG. 2B is a side cross-sectional view of the plasma source illustrate in FIG. 2A according to one embodiment of the present invention.

FIG. 2A is an isometric view of one embodiment of the plasma source 1000 that is coupled to a process chamber 1020 so that gas radicals and/or gas ions formed in a plasma generating region 1118 (FIG. 2B) of a plasma controlling device 1072 found in the plasma source 1000 can be delivered to a processing region 1128 (FIG. 2B) of a process chamber 1020. The gas radicals and/or gas ions formed in the plasma generating region 1118 are then used to enhance the deposition, etching and/or cleaning process(es) performed on the process chamber components and/or substrate disposed therein. FIG. 2B is a cross-sectional view of the plasma source 1000 shown in FIG. 2A, which is formed by cutting the plasma source 1000 along an X-Y plane (FIG. 2A) that passes through the central axis 1130S of the core element 1130. In this configuration, the plasma source 1000 comprises a plasma controlling device 1072 and the process chamber 1020 that are useful for practicing one or more of the embodiments described herein. In some plasma source configurations, due to the configuration and/or positioning of the plasma generating region 1118 relative to a substrate or chamber component disposed in the processing region 1128 of the process chamber 1020, the amount of charged species (e.g., ions, electrons) diffusing out of the plasma generating region 1118 (e.g., reference "A" in FIGS. 2B-2D) will preferably only minimally reach and interact with a substrate or chamber component during processing. The diffusion or flux of the gas radicals and/or gas ions from the plasma generating region 1118 to the processing region 1128 can also be controlled by adjusting the processing pressure and/or flow of the gas atoms through the plasma generating region 1118 from the gas source 1124. However, in some cases, the plasma source 1000 is configured so that a small amount of charged species interaction with the surface of a substrate disposed in the processing region 1128 of the process chamber 1020 occurs to further promote an etching or CVD type deposition process.

As illustrated in FIG. 2B, the process chamber 1020 can include a chamber body 1021 that has one or more walls that enclose the processing region 1128, such as chamber sidewalls 1005 and a chamber lid 1010. In some configurations, a substrate pedestal 115, which is used to support a substrate 1030, is disposed adjacent to an inlet 1011 formed in the chamber lid 1010. In general, the inlet 1011 is in fluid communication with the plasma generating region 1118 of the plasma source 1000. In some embodiments, a showerhead assembly 1027 is disposed between the inlet 1011 and the substrate pedestal 1015 to provide a uniform distribution of gas radicals and/or gas ions formed in the plasma generating region 1118 to be delivered through holes 1026 formed in the showerhead assembly 1027 to a surface 1031 of the substrate 1030. The showerhead assembly 1027 may be electrically grounded or floating, and the size and density of the holes 1026 may be selected to adjust the amount and uniformity of the gas radicals and/or gas ions entering the processing region 1128. A backside gas supply 1016 may also be provided to furnish a gas, such as argon or helium to a gap (not shown) formed between the backside of the substrate 1030 and the substrate pedestal 1015 to improve thermal conduction between the temperature controlled substrate pedestal 1015 and the substrate 1030. A process gas supply 1025 can be used to furnish a process gas into the processing region 1128. A vacuum pump system 1035 comprising a turbo pump, rough pump and/or other similar device controls the pressure within the process chamber 1020 and/or plasma source 1000. In one example, the pressure within the processing region 1128 and/or plasma generating region 1118 during processing is maintained at a vacuum pressure, such as between about 0.5 milliTorr (mT) and about 1 Torr. In some embodiments, a shield 1129 is directly or indirectly mounted on the chamber lid 1010 to house the plasma controlling device 1072. The top of the shield 1129 is provided with an opening (not shown) that corresponds to the location of the gas inlet 1120. The shield 1129 is designed to reduce the effects of the fields produced by the plasma controlling device 1072 and is preferably made of high Mu material, such that all the generated fields are kept in the internal region of the shield 1129.

In some embodiments of the invention, the plasma controlling device 1072 is attached or mounted on the chamber lid 1010 of the process chamber 1020, and is configured to produce and introduce a gas radicals and/or ionized gas atoms into the processing region 1128 of the process chamber 1020. The plasma controlling device 1072 may be spaced apart and electrically isolated from the components in the process chamber 1020 by an isolation plate 1145, which is made from a dielectric material (e.g., ceramic material). The plasma controlling device 1072 generally contains a magnetic core, or hereafter core element 1130, a source assembly 1038 coupled to the core element 1130 and a processing region assembly 1073. The plasma generating region 1118, which is generally symmetrically distributed around the core element 1130, may be enclosed by one or more components found in the processing region assembly 1073. In one embodiment, the processing region assembly 1073 comprises a dome portion 1110, a plasma block 1116, a cooling plate 1134, and a side cover 1140, that enclose the plasma generating region 1118.

During operation of the plasma source 1000, a substrate 1030 is placed on the substrate pedestal 1015 in the process chamber 1020 for processing. The plasma generating region 1118 of the plasma source 1000 may then be pulled to a predetermined pressure/vacuum by the vacuum pump system 1035. Once the predetermined pressure is achieved, a deposition, etching or cleaning gas(es) may be introduced into the plasma controlling device 1072 via the gas inlet 1120 and flow through the plasma generating region 1118 from the gas diffuser body 1122, while the vacuum pump system 1035 continues to pump the plasma source 1000, such that an equilibrium processing pressure is obtained. The processing pressure is adjustable through, for example, throttling the communication of the vacuum system to the plasma source 1000 or adjusting the flow rate of the process or clean gases being introduced into plasma source 1000 through the gas inlet 1120. Once the pressure and gas flows are established, a power source is activated. An RF power source, such as the source assembly 1038, is electrically connected to a coil 1132. The fields generated by the coil 1132 inductively forms a magnetic field in the core element 1130 that inductively couples the delivered energy to a gas disposed in the plasma generating region 1118 to excite the gas into a plasma state. In one embodiment, the ion density and radical concentration in the formed plasma may be increased or decreased through adjustment of the power supplied to the coil 1132 or through adjustment of the processing pressure in plasma source 1000.

Figure 2C:
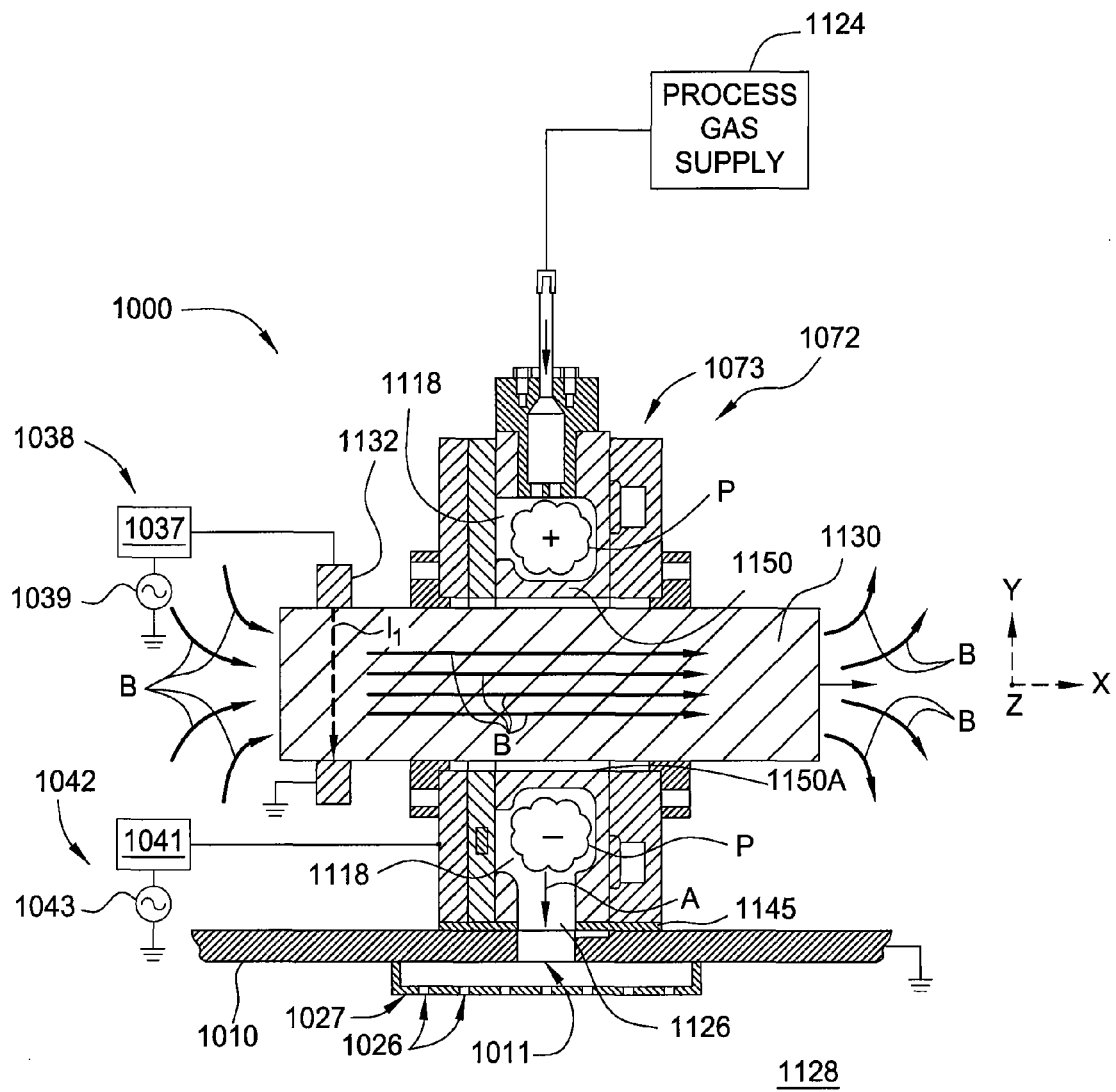
FIG. 2C is a side cross-sectional view of the plasma block illustrated in FIG. 2A according to one embodiment of the present invention.
Figure 2D:
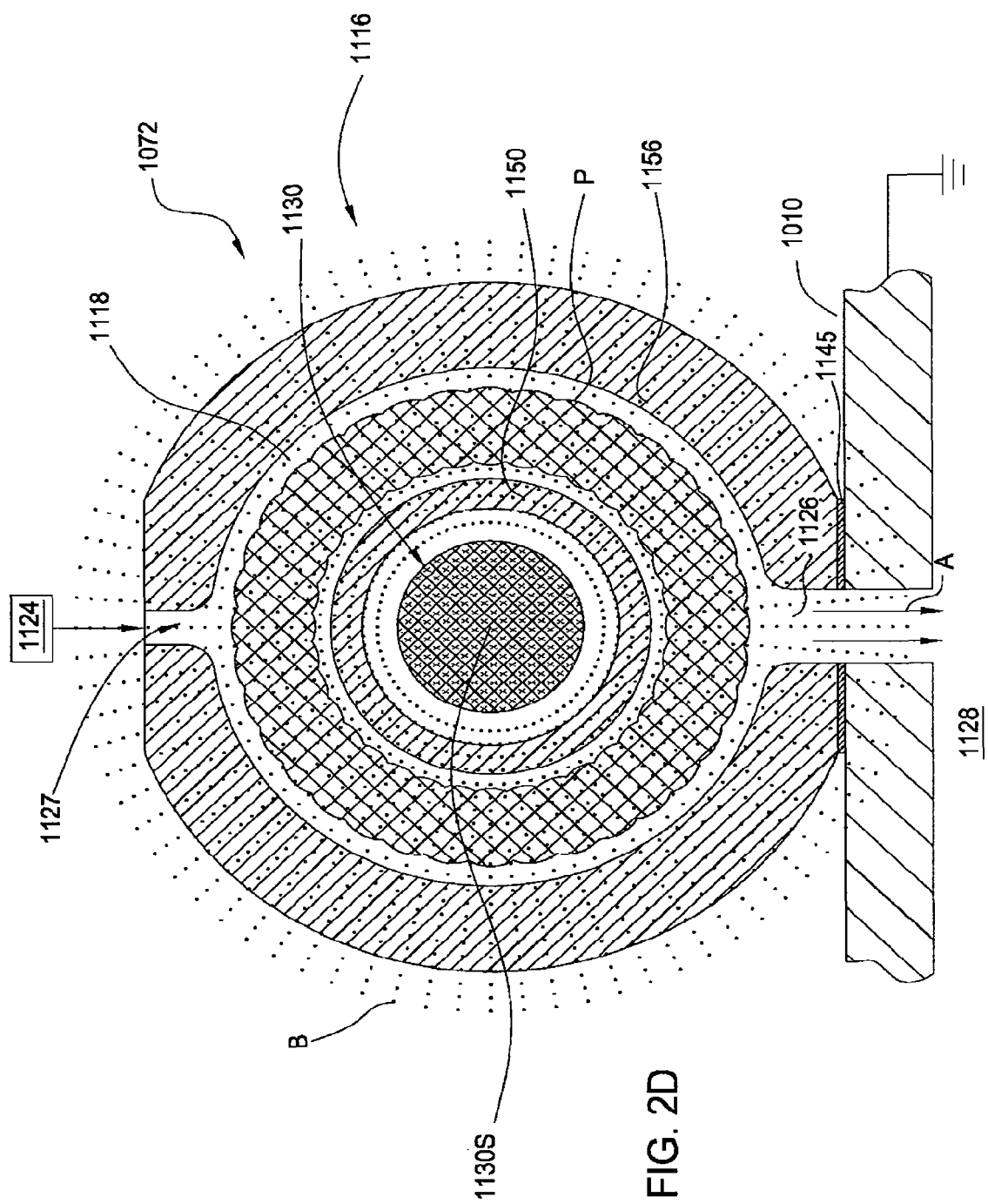
FIG. 2D is a side cross-sectional view of a plasma block according to one embodiment of the present invention.
Figure 2E:
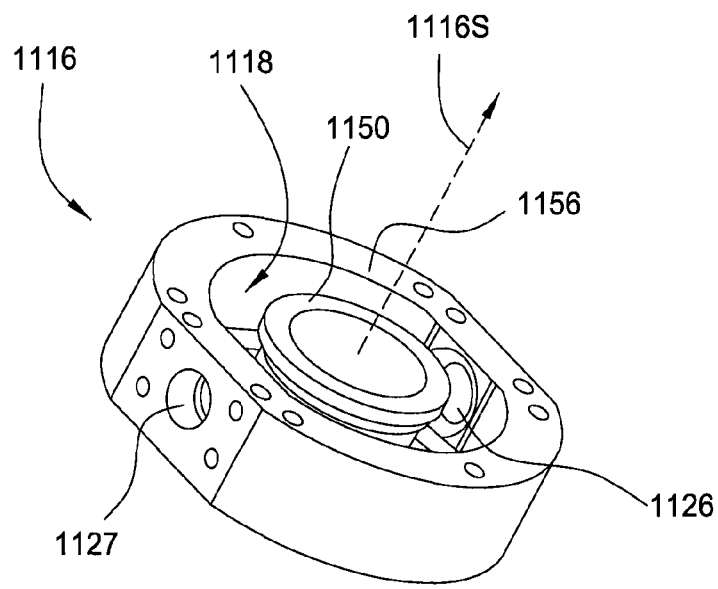
FIG. 2E is an isometric view of a plasma block according to one embodiment of the present invention.

The plasma block 1116, as illustrated in FIGS. 2B, 2D and 2E, comprises a component that has at least a portion of an annular shaped plasma generating region 1118 formed therein. The annular shaped plasma generating region 1118 is generally formed around the core element 1130. In one embodiment, as illustrated in FIG. 2B, the annular shaped plasma generating region 1118 has a rectangular shaped cross-section. However, the shape of the cross-section of plasma generating region 1118 could be any desirable shape, such circular, elliptical or other useful shape, and thus the rectangular shaped plasma generating region is not intended to be limiting as to the scope of the invention described herein. In one configuration, the plasma generating region 1118 is at least partially enclosed by an inner wall 1150, an outer wall 1156, and a side wall 1158 (FIG. 2B) formed in the plasma block 1116. In one embodiment, the plasma generating region 1118 is fully enclosed by the walls 1150, 1156, 1158 of the plasma block 1116 and the side cover 1140 that is attached to the plasma block 1116 by use of conventional fasteners (not shown). In one configuration, as shown in FIG. 2E, an annular shaped plasma generating region 1118 comprises a volume that is formed about a central axis 1116S. In one configuration, the volume of the annular shaped plasma generating region 1118, neglecting the added volume of the outlet port 1126 and inlet port 1127 regions, generally is equal to the area of the cross-section of plasma generating region (e.g., rectangular section) revolved about the central axis 1116S. In some embodiments, the annular shaped plasma generating region 1118 may be completely or substantially symmetric about the central axis 1116S.

The core element 1130, as illustrated in FIG. 2B, is generally disposed through a portion of the plasma block 1116 near an adjacent surface 1150A of the inner wall 1150 of the plasma block 1116. In one aspect, the core element 1130 comprises a high magnetic permeability rod or tube, for example, a ferrite rod, but could be other magnetic material depending on the coupling structure. The magnetic material from which the core element 1130 is formed will generally have the following characteristics: 1) a low core loss density at high impressed frequencies, 2) have a high Curie temperature, and 3) have a high bulk resistivity. In general, the core element 1130 can be formed from any material that can be used to provide a path through which the generated fields (e.g., magnetic fields) created by the flow of RF current through one or more coils (e.g., coil 1132) found in the source assembly 1038, will preferentially flow. In one embodiment, the core element 1130 comprises a ferrite containing element. While the term "ferrite element" and "ferrite material" are used herein, these terms are not intended to be limiting as to scope of invention described herein. Also, in one embodiment, the core element 1130 comprises a bundle of smaller diameter cylinders or rods that are aligned about a center axis, such as the central axis 1130S which is coincident with X-axis shown in FIG. 2B.

FIG. 2C is a close-up cross-sectional view of the plasma controlling device 1072 illustrated in FIG. 2B that generally schematically illustrates one embodiment of the invention in which an inductively coupled plasma "P" is formed in the plasma generating region 1118 by delivering energy from a source assembly 1038 that induces a magnetic field (i.e., B-field "B") in the core element 1130. The induced magnetic field thus creates an electric field in the plasma generating region 1118 that is used to excite the gas atoms disposed therein into an excited state to form a plasma that will contain gas radicals and/or ions. During plasma processing, a processing gas is delivered into the plasma generating region 1118 through an inlet port 1127 formed in the outer wall 1156 of the plasma block 1116 and the excited gas atoms exit the plasma generating region 1118 through an outlet port 1126 that is also formed in the outer wall 1156 of the plasma block 1116. The outlet port 1126 thus fluidly couples the plasma generating region 1118 to the processing region 1128 of the process chamber 1020. Therefore, the chemistry of the gas delivered to the processing region 1128 of the process chamber 1020 can be controlled by the process gas supply 1124 and the energy of the gas atoms can be controlled by the gas atom residence time in the plasma generating region 1118 (e.g., proportional to flow rate), the delivered RF power, the composition of the gases in the plasma generating region 1118 and the pressure of the plasma generating region 1118.

During plasma processing, an RF current $I_1$ (FIG. 2C) is delivered through the coil 1132, which is wound around a portion of the core element 1130, that creates a magnetic field "B" that flows through the core element 1130 which creates an electric field that passes through the plasma generating region 1118 (see "+" and "−") and causes gas atoms disposed therein to form a plasma "P." In one embodiment, the power delivered to the coil 1132 may vary between about 0.1 Watts to about 10 kWatts at a RF frequency of about 400 kHz, while a gas is delivered at a flow rate between about 0.5 sccm and about 100 lpm and the pressure is maintained at between about 1 mTorr and about 500 Torr. It is contemplated that the frequency of the power delivered by the RF power source is not limited to frequencies around 400 kHz and may be run at a desired frequency such as about 10 kHz to greater than 40 MHz, depending upon the application. In some cases, it is desirable to deliver the RF power from the RF power source at frequencies less than or equal to about 13.56 MHz.

Figure 1:
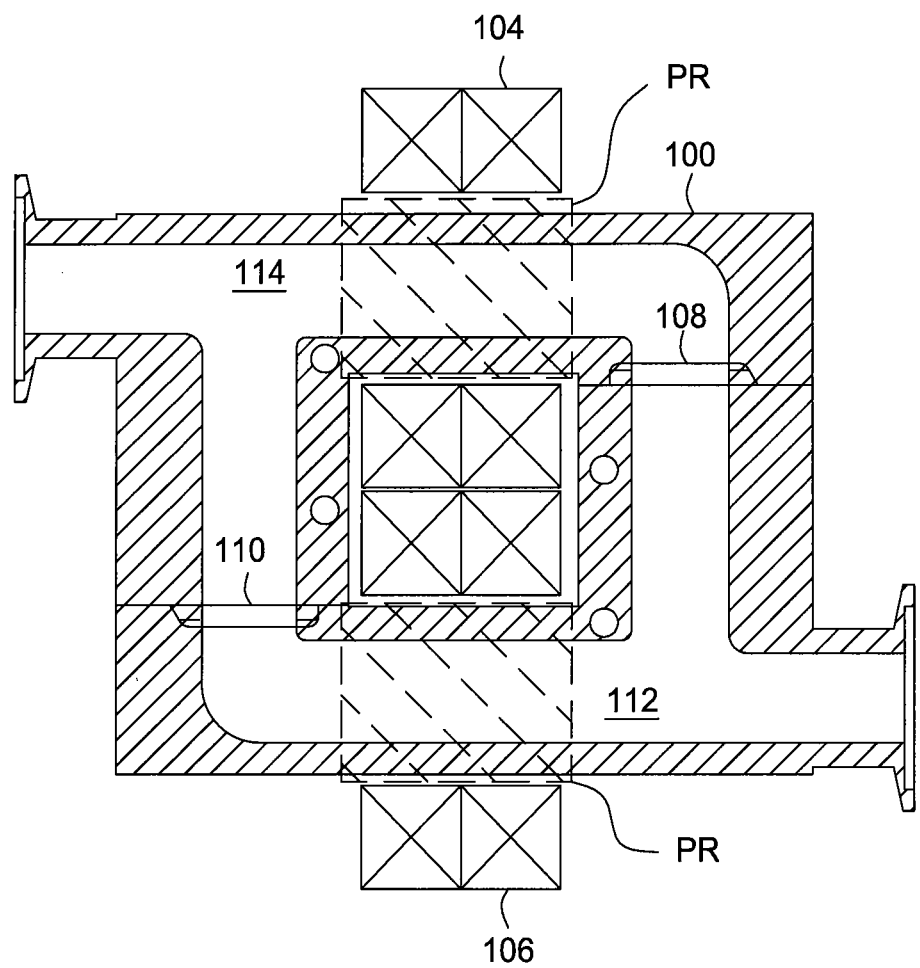
FIG. 1 illustrates a cross-sectional view of a conventional remote plasma source device.

By use of the plasma source 1000 configuration described herein, it is believed that process window, energetic gas atom creation efficiency and range of gas radical energies can be greatly improved over conventional plasma generating devices. It is believed that the use of an enclosed plasma generating region 1118 that is symmetrically formed around a magnetically permeable core element (e.g., core element 1130) has a number of advantages over other conventional designs. First, due to the core element 1130 shape and the symmetric orientation of the plasma generating region 1118, a plasma having a uniform density can be formed therein, as schematically illustrated in FIG. 2C and 2D. The symmetrically formed plasma generating region 1118 is used to improve the coupling efficiency of the delivered RF power by delivering the RF energy over a wider area, and avoiding the efficiency problems created by the common "hot spot" issue found in conventional RPS designs, as discussed above. Second, due to the symmetric shape of the plasma generating region 1118 about the core element 1130 the common problem of having non-uniform field density in different regions of the plasma generating region found in conventional RPS designs, such as a square plasma generating region (FIG. 1) and the localized small plasma coupling region (e.g., "PR" region in FIG. 1) are removed. The non-uniform field density found in conventional RPS designs can have an effect on the radical generation efficiency and the unwanted interaction of the excited gas atoms with portions of the surface of plasma generating region.

In some embodiments of the invention an "open loop" magnetic field, or magnetic field is able to evenly distributed all 360 degree around the center axis of the magnetically permeable core element 1130, is generated due to the coupling of the coil 1132 to the core element 1130. The "open loop" magnetic field will thus help make the plasma density uniform within the plasma generating region 1118. In some embodiments, the magnetically permeable core element 1130 of the present invention is an "open loop" design that is generally extended straight through the plasma block 1116, instead of a "closed loop" design as typically seen in the conventional torroidal plasma chamber antenna or RPS designs, where a winding or coil section is wrapped around a closed magnetically permeable core that surrounds a conduit in which the plasma is generated. As discussed above, conventional "closed loop" designs will have a higher magnetic field only at certain regions around the conduit at which the closed loop core element is positioned.

FIG. 2D is a schematic side cross-sectional view of the plasma generating region 1118 formed in the plasma block 1116, in which a plasma "P" is formed by the fields (B-fields "B") passing through portions of the plasma source 1000. As illustrated in FIG. 2D, the B-fields formed in the core element 1130, which flow into the page (i.e., "X" sign), and the returning B-fields (i.e., "•" sign), which flow out of the page, are uniformly distributed circumferentially about the axis of the core element 1130 (e.g., uniform 360° at a fixed radial position). One skilled in the art will appreciate that the position of the plasma controlling device 1072 relative to the grounded chamber lid 1010 and the symmetrically generated fields and plasma formed in the plasma generating region 1118 generally remain outside of the processing region 1128 of the process chamber 1020, but allows the migration of the generated gas radicals and some gas ions into the processing region 1128, so that they can interact with the substrate and process chamber components. In one embodiment, it is desirable to position the plasma generating region 1118 a distance away from the substrate 1030 so that the plasma generated in the plasma generating region 1118 does not interact with the surface 1031 of the substrate, which will tend to form an appreciable plasma potential and plasma sheath on the substrate that can cause ion bombardment and damage.

Core Element Design

FIGS. 2A-6B generally schematically illustrate a single core element 1130 that is useful for forming a uniform plasma in an enclosed plasma generating region. As noted above, in some embodiments, the core element 1130 need not be a single monolithic element, but may comprise a series of smaller elements that are bundled together to provide a path through which the generated fields (e.g., magnetic fields) will preferentially flow, or may be formed in various different shapes and configurations as will be discussed below.

In one embodiment, as shown in FIGS. 2A-6B, the core element 1130 comprises a bar shaped element that is disposed through the plasma block 1116. In this configuration, the core element 1130 has a bar shape, or straight length shape, as opposed to a ring, square or other enclosed shape that surrounds the plasma block 1116, as commonly found in conventional designs. The straight bar shape of the core element significantly improves the ion density in the plasma generating region 1118 (FIG. 2B), because the inductively generated fields are able to spread out, since they do not have an enclosed core element through which to preferentially flow. Thus, the fields generated from the straight bar shaped core element are not constrained to a small region of the plasma generating region. The evenly distributed magnetic fields will thus tend to form the plasma density uniform through the symmetrically formed plasma generating region 1118.

Figure 2H:
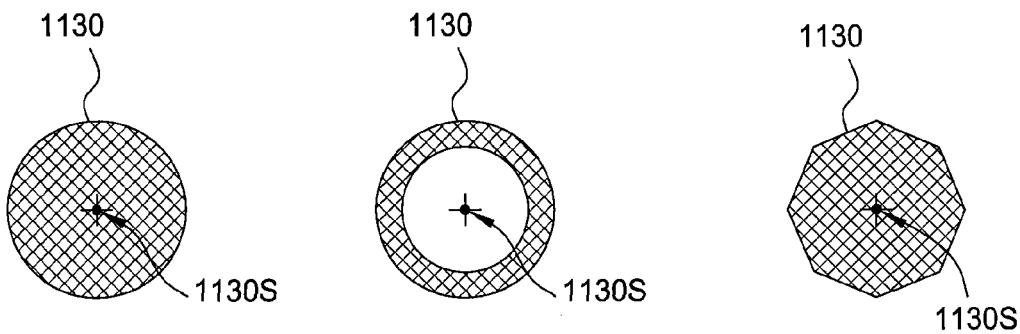
FIG. 2H illustrates three examples of cross-sectional shapes of core elements that may be used in a plasma source according to one embodiment of the present invention.

In some configurations, the core element 1130 is bar shaped and has a cross-section that is regular or symmetric about a central axis 1130S, such as a circular or cylindrical cross-section. In one example, the cross-section of the core element 1130 is circular and has a diameter of between about 0.5 inch and about 2 inches and a length of between about 3 inch and about 20 inch. In one example, the ratio (L/d) of the length (L) to the diameter (d) of the core element 1130 is between about 1.5 and about 40, such as between about 2 and about 10. Although the core element 1130 is described here as cylindrical, it is contemplated that the cross-sectional shape of the core element 1130 may be non-circular or non-cylindrical such as square, hexagonal, rectangular, or any other desired shape, either regular or irregular. FIG. 2H illustrates examples of three cross-sectional shapes of different core elements that may be used in the plasma source 1000. In this example, the core element 1130 may have a circular cross-sectional shape as shown in "cross-section I", a tubular cross-sectional shape as shown in "cross-section II", or a hexagonal cross-sectional shape, which is regularly shaped about the central axis, as shown in "cross-section III". In another example, the core element 1130 may have a circular cross-sectional shape with one or more features formed therein, such as core element 1721 in FIG. 7B. In one embodiment, a bar shaped core element 1130 has two ends 1131A and 1131B (FIG. 2B) that are disposed at opposite ends of the core element 1130. Therefore, in a straight bar shaped core element configuration, a straight line coincident with the central axis 1130S of the core element 1130 will pass through the two ends 1131A and 1131B.

It has been found that changes in the core element's physical or electrical properties can a have significant impact on the efficiency, stability and reliability of the plasma source. One skilled in the art will appreciate that both the saturation flux density and the magnetic permeability decrease as the temperature of the core element 1130 increases. Therefore, to overcome the rise in the temperature of the core element 1130 during plasma processing, due to "eddy current" heating, active cooling of the core element 1130 is generally required.

Figure 7A:
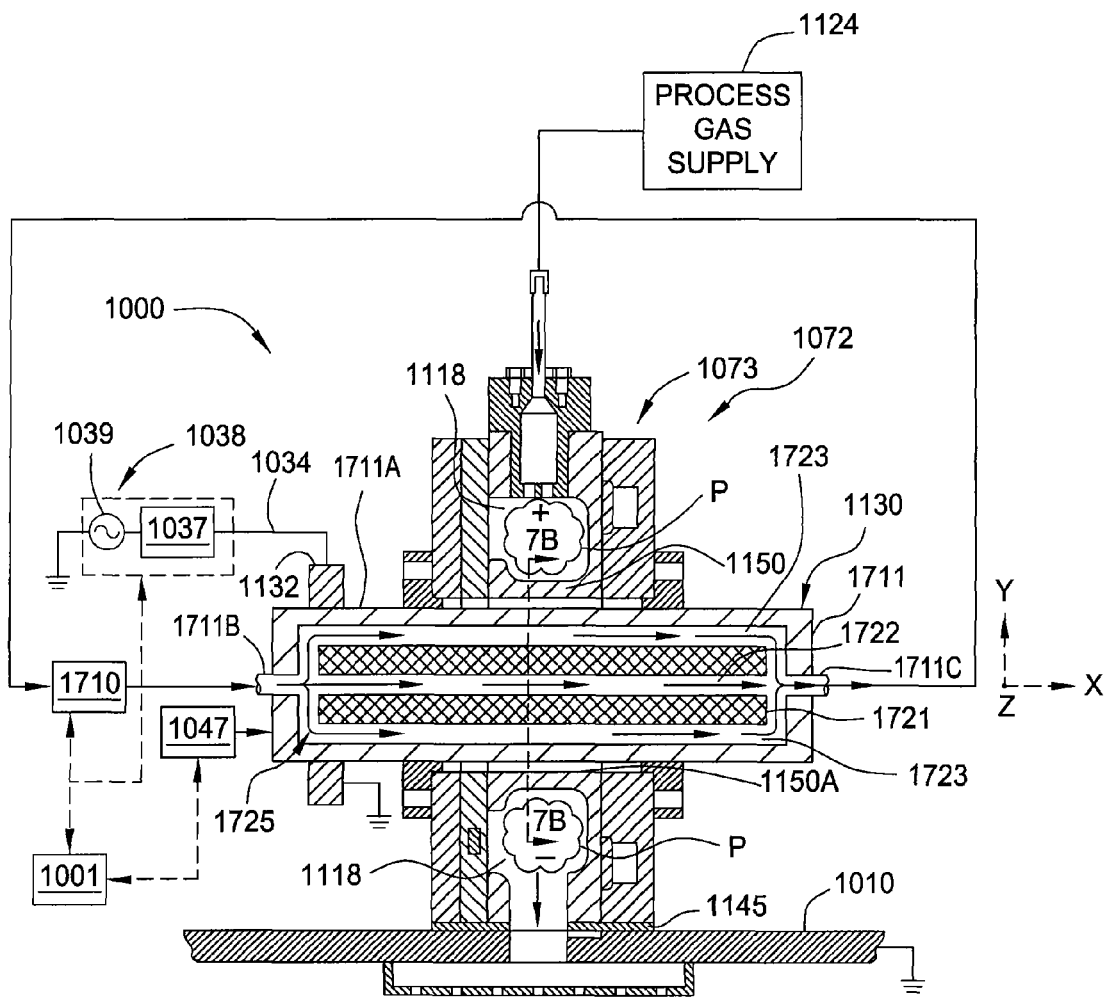
FIG. 7A is a side cross-sectional view of a plasma chamber having a temperature controlled core element according to another embodiment of the present invention.
Figure 7B:
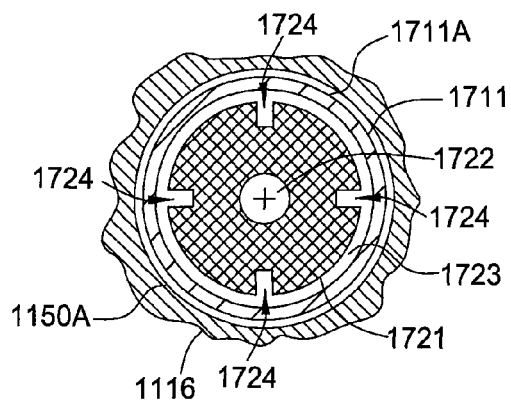
FIG. 7B is a side cross-sectional view of portion of the temperature controlled core element shown in FIG. 7A according to another embodiment of the present invention.

FIG. 7A is side cross-sectional view of one embodiment of a plasma source 1000 that has a temperature controlled core element 1130. FIG. 7B is a side cross-sectional view of the core element 1130 according to an embodiment of the invention. In one embodiment, the plasma source 1000 comprises a core element 1130 and heat exchanger assembly 1710. In one embodiment, during the operation of the plasma source 1000 a temperature controlled heat exchanging fluid is delivered from the heat exchanger assembly 1710 through a portion of the core element 1130 and then returned back to the heat exchanger assembly 1710. In general, the heat exchanger assembly 1710 comprises a conventional fluid heat exchanging device, such as a fluid recirculating chiller. In general, the heat exchanging fluid will have a high electrical resistivity and good heat transfer characteristics, such as deionized water. In one embodiment, as shown in FIG. 7A, the core element 1130 generally comprises a magnetic permeable core element 1721 that is enclosed within a housing 1711. In this configuration, the heat exchanging fluid delivered from the heat exchanger assembly 1710 flows within the housing 1711 and around and through portions of the magnetic permeable core element 1721 to remove the generated heat formed therein. The magnetic permeable core element 1721 generally comprises a high magnetic permeability material, such as a ferrite rod as discussed above in conjunction with FIGS. 2B-2G.

The housing 1711, in one embodiment, is sized to allow the heat exchanging fluid to pass within a gap 1723 (FIG. 7B) formed between the outer surface of the core element 1721 and the inner surface of the housing 1711. The core element 1721 may contain a center channel 1722 and/or a plurality of features 1724, such as grooves, that are formed in a surface of the core element. The center channel 1722 and/or a plurality of features 1724 are generally configured to receive the flowing heat exchanging fluid to improve the heat transfer between the flowing fluid and the core element 1721. In one configuration, the core element 1721 is supported and aligned within the housing 1711 and the plasma block 1116 by supporting features (not shown) that engage with features formed in the core element, such as the center channel 1722 or features 1724. In some configurations, fluid flow distributing features (not shown), such as porous plates, may be disposed at the inlet port 1711B and/or the outlet port 1711C to help promote a uniform flow of the heat exchanging fluid around and through the core element 1721.

Referring to FIG. 7B, in one embodiment, the housing 1711 is formed so that the outer surface 1711A of the housing 1711 will not appreciably deflect when the heat exchanging fluid is delivered through the internal region 1725 of the housing 1711. In this configuration, the housing 1711 is formed from a rigid dielectric material, such alumina ($Al_2O_3$), quartz, aluminum nitride, a composite material or other suitable material. In an alternate embodiment, the housing 1711 is formed so that the outer surface 1711A of the housing 1711 is configured to deflect when the heat exchanging fluid is delivered through the internal region 1725, so that the outer surface 1711A can expand to allow contact to be made between a portion of the inner surface 1150A of the plasma block 1116 and the outer surface 1711A of the housing 1711. The contact created between the inner surface 1150A of the plasma block 1116 and the outer surface 1711A of the housing 1711 will allow the heat generated in the plasma generating region 1118 to be transferred to the heat exchanging fluid flowing through the housing 1711. In this configuration, the housing 1711 is formed from flexible a dielectric material, such as a plastic material, fiber impregnated resin material, elastomeric material, a composite material or other suitable material that is flexible and has a desirable thermal conductivity.

In one embodiment of the plasma source 1000, which is further discussed below, an actuator 1047 and a system controller 1001 are used to adjust and tune the position of the core element 1130, which may include the housing 1711 and core element 1721, relative to the plasma generating region 1118 to improve the RF coupling to the gas disposed therein. In one configuration, a sensor in the power supply delivering energy to the coil 1132, attached to another region of the power delivery circuit, or in communication with the plasma generating region 1118 is used to feed back information to the system controller 1001 about the state of the plasma generated in the plasma generating region 1118, so that the energy coupling to the plasma can be adjusted by the system controller 1001. The information measured by the sensor and returned to the system controller 1001 may include the amount of reflected power, chamber impedance, plasma density, optical emission of the plasma, or other useful information about the state of the plasma formed in the plasma generating region 1118.

Plasma Block

To avoid the material compatibility issues found in conventional torroidal or RPS designs, as discussed above, the plasma block 1116 is formed from a material that will not react with the gas radicals or ions formed in the plasma generating region 1118 or with the reactive process gases. In general, the plasma block 1116 is formed in a shape that is symmetric about the core element 1130 and comprises a material that will not be appreciably attacked by the plasma chemistry and has a high thermal conductivity to transfer the heat generated by the plasma to a heat exchanging device. In one embodiment, the plasma block 1116 comprises a high thermal conductivity dielectric material that is formed to a desired symmetric shape. A plasma block 1116 that comprises a solid dielectric material has many advantages over conventional designs, since it avoids the coating defect and possible damage issues commonly found in conventional RPS designs. It is generally hard to create a fully enclosed plasma processing region by joining two halves that have a coating on the interior surface, since it is hard to assure that surface coatings at the joints between the halves will remain undamaged during the formation process. Use of a solid dielectric material also eliminates the need for insulating blocks (e.g., reference numerals 108, 110 in FIG. 1) that are typically disposed between portions of a conventional metal containing plasma enclosed region to eliminate the formation of eddy currents in these metal containing regions. In one embodiment, the plasma block 1116 is made from aluminum oxide ($Al_2O_3$), aluminum nitride (AlN), beryllium oxide (BeO), boron nitride (BN), quartz or other similar materials. In one example, the plasma block 1116 is made from an aluminum nitride material that is about 2 inches thick (X-direction in FIG. 2B). In one embodiment, the inner surface 1150A of the inner wall 1150 may be between about 2 inches and about 5 inches in diameter, the inner surface of the outer wall 1156 may be between about 5 inches and about 10 inches in diameter, and the perimeter of the plasma block 1116 may range from between about 10 inches and about 30 inches, depending upon application.

Referring back to FIG. 2B, in an effort to further assure that the plasma block 1116 and related components remain cool during processing, a cooling plate 1134 is generally attached to the side wall 1158 of the plasma block. The cooling plate 1134 is thus adapted to remove the heat generated during processing to prevent any seals or connected components from becoming damaged during processing. In one embodiment, the cooling plate 1134 has a substantially circular cooling channel 1138 embedded therein to receive and circulate a cooling medium, such as water that is delivered from the heat exchanging source 1139. Although only one cooling plate and channel 1134, 1138 is shown in FIG. 2A, in one embodiment of the present invention a second cooling plate 1146 (FIG. 2B) with a similar cooling channel may be arranged at the opposing side of the side wall 1158 of the cooling channel 1133, which is attached to the side cover 1140. In one embodiment, the temperature controlled cooling medium is delivered to the coolant inlets 1143 (FIG. 2A) and returned from the coolant outlets 1144 (FIG. 2A) formed in the first and second cooling plates 1134, 1146 by use of the heat exchanging source 1139.

Plasma Formation and Power Delivery

As noted above, the core element 1130 generally provide a path through which the generated fields (e.g., magnetic fields), created by the flow of RF current through one or more coils (e.g., coil 1132) found in the source assembly 1038, will preferentially flow to create a plasma in the plasma generating region 1118. In one configuration, a coil 1132 is wrapped around an outer portion of the core element 1130 to inductively couple the coil to the core element 1130. In one embodiment, the coil 1132 comprises a multiple turns of a conductive material, such as a copper strip or wire, that is connected to a source assembly 1038. In one example, the coil 1132 comprises between about one and twenty turns of coil, such as between about three and five turns.

The source assembly 1038 may use one or more dynamic impedance matching elements to efficiently delivery RF power to the coil 1132. In one configuration, the source assembly 1038 may use frequency tuning elements, impedance matching network tuning, or frequency tuning with forward power servoing to minimize the reflected power and efficiently deliver the RF energy to the coil 1132 and plasma generating region 1118. In one embodiment, the source assembly 1038 comprises an impedance matching element 1037 and an RF power source 1039. The RF power source 1039, which may be external to the plasma controlling device 1072, electrically couples to the coil 1132 through the impedance match element 1037 and provides RF energy to the coil 1132.

In one embodiment of the plasma source 1000, a second RF power source assembly 1042 may be further provided to deliver RF power to a portion of the plasma generating region 1118 using an ignition promoting electrode, so that the plasma can be more easily ignited therein. In one embodiment, the second RF power source assembly 1042 comprises an impedance matching element 1041 and an RF power source 1043. The RF power source 1043, which may be external to the plasma controlling device 1072, is electrically coupled to the ignition promoting electrode, such as the first cooling plate 1134 and/or the second cooling plate 1146 (FIG. 2B), to capacitively couple the energy delivered to the electrode to the gas atoms disposed in the plasma generating region 1118. In one example, as shown in FIG. 2B, the RF power source 1043 is configured to provide an RF bias to the second cooling plate 1146, such as between about 200 Volts and about 10 kVolts, to ignite the plasma in the plasma generating region 1118. The first and second cooling plates 1134, 1146 may be formed from a conductive material (e.g., metal) that is disposed adjacent and parallel to the plasma generating region 1118. At least a portion of the core element 1130 may pass through center of the annular shaped first and second cooling plates 1134, 1146. In one configuration, the first and second cooling plates 1134, 1146 each have a radial "cut," or "break" (e.g., reference numeral 1146A in FIG. 2A), that inhibits the formation of eddy currents in the annular shaped element due to the fields generated by the core element 1130 during processing. The isolation plate 1145, which is generally disposed between the plasma controlling device 1072 and the chamber lid 1010, enables the use of ignition promoting electrode(s) that have a large surface area that is RF "hot" for improving the capacitive coupling to the gas disposed in the plasma generating region 1118 during plasma ignition and processing. The isolation plate 1145 prevents the electrodes from being shorted to ground through the grounded components found in the processing chamber 1020.

In another configuration, the RF power source 1043 is electrically coupled to an electrode 1142 (FIG. 2B) that is embedded within the side cover 1140 to capacitively couple the energy delivered to the electrode 1142 to the gas atoms disposed in the plasma generating region 1118. The electrode 1142 may be a conductive annular plate (e.g., metal) that has a surface 1142A that is disposed adjacent and parallel to the plasma generating region 1118. At least a portion of the core element 1130 may pass through center of an annular shaped electrode 1142. In one configuration, the electrode 1142 is separated and physically isolated from the plasma formed in the plasma generating region 1118 by a dielectric material, and may also contain a radial "cut," or "break", that inhibits the formation of eddy currents in the annular shaped element due to the fields generated by the core element 1130 during processing.

In an alternate embodiment, impedance matching may be achieved by use of a tuning capacitor 1036 that is attached to the coil 1132 that is wound around the core element 1130. The capacitance of the tuning capacitor 1036 is selected to resonate the coil 1132 at the frequency of the energy delivered from the RF power source 1039. In one embodiment, dynamic impedance matching is used in conjunction with the tuning capacitor 1036 configuration. In this case, the RF energy delivered to the plasma source 1000 is more efficiently delivered to the plasma generating region than conventional power delivery schemes that use a switching power supply, since the delivered energy does not require the use of a duty cycle (i.e., pulsed on/off power distributed over time) to control the delivery of power to a processing gas to form a plasma. The non-intermittent delivery of power to the plasma improves the efficiency of the plasma generation process and improves the ability to adjust the power level delivered to the plasma.

Figure 2F:
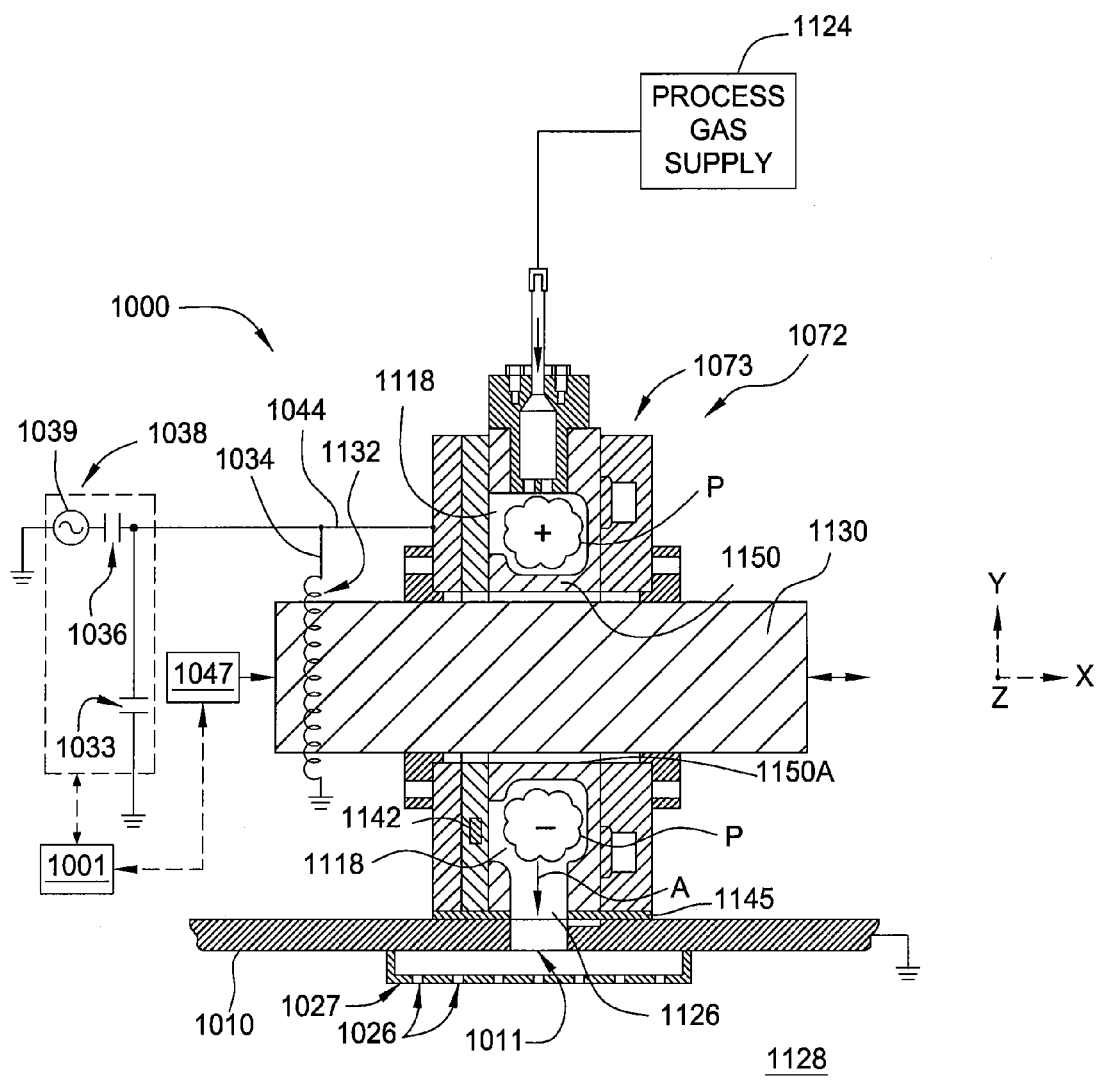
FIG. 2F is a schematic side cross-sectional view of a source assembly that is used to form the plasma in a plasma generating region of a plasma source according to one embodiment of the present invention.

As illustrated in FIG. 2F, in some configurations the source assembly 1038 may comprise a series of fixed electrical elements that are driven by the RF power source 1039 to form the plasma in the plasma generating region 1118. The use of fixed electrical elements in a power delivery circuit, versus the use of an active RF match, is advantageous since it is able to reduce the complexity of the source assembly 1038 and plasma source 1000. In one embodiment, as shown in FIG. 2F, a capacitor 1033 is coupled at one end to ground and at the other end to the RF power source 1039 through an optional tuning capacitor 1036. The RF power source 1039 and optional tuning capacitor 1036 are also coupled to the feed circuit 1034 and ignition circuit 1044. In this configuration, a single RF power source 1039 is able to form the plasma in the plasma generating region 1118 using an ignition circuit 1044 that is coupled to an ignition promoting electrode, while also sustaining the plasma in the plasma generating region 1118 through use of a feed circuit 1034. The feed circuit 1034 is coupled to the coil 1132 that is schematically shown as an inductive coil type element in FIG. 2F. In this case, the second RF power source assembly 1042 is not needed, due to the addition of the ignition circuit 1044 connection to the ignition promoting electrode(s), such as the first cooling plate 1134, the second cooling plate 1146 and/or the electrode 1142. In one example, the capacitor 1033 and the tuning capacitor 1036 are selected to allow the formed RF circuit to perform near resonance, and in one example, each may comprise a 0.5 to 300 nano-Farad capacitor. To avoid reflected power problems the RF power source 1039 may be used in a frequency tuning mode to efficiently deliver power to the coil 1132 and plasma generating region 1118.

To further improve the coupling of the delivered RF energy to the plasma generating region 1118 from a source assembly 1038, an actuator 1047 and system controller 1001 are used to adjust and tune the position of the core element 1130 relative to the plasma generating region 1118 to improve the RF coupling to the gas disposed therein. It has been found that by adjusting the position of the core element 1130 relative to the plasma generating region 1118 the electrical characteristics and coupling efficiency can be adjusted. Therefore, in one embodiment, during the initial setup of the plasma source 1000, one may adjust the position of the core element 1130 relative to the plasma generating region 1118 to maximize the power coupling, and then fix the core elements 1130 in this position.

Alternately, the position of the core element 1130 may be adjusted relative to the plasma generating region 1118 during one or more steps of a substrate processing sequence performed in the process chamber 1020 by use of the actuator 1047 and system controller 1001. In one configuration, the actuator 1047 is a servomotor or stepper motor that is able to adjust, closed-loop control and/or optimize the position of the core element 1130 in the $^+$X-direction or $^-$X-direction (FIG. 2F) by use of sensors coupled to the actuator (e.g., motor encoders), sensors that are able to detect the variation in the delivered forward and reflected RF power, and the system controller 1001. In one embodiment, the system controller 1001 is generally adapted to control all of the components contained within the plasma source 1000. The system controller 1001 is generally designed to facilitate the control and automation of the plasma processing techniques described herein and typically may include a central processing unit (CPU) (not shown), memory (not shown), and support circuits (or I/O) (not shown). The CPU may be one of any form of computer processors that are used in industrial settings for controlling various processes and hardware (e.g., motors, power supplies, chamber hardware) and monitor the processes (e.g., substrate temperature, gas flow rate, amount of energy delivered to the core element, position of the core element). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the system controller determines which tasks are performable on a plasma source and substrate.

Figure 2G:
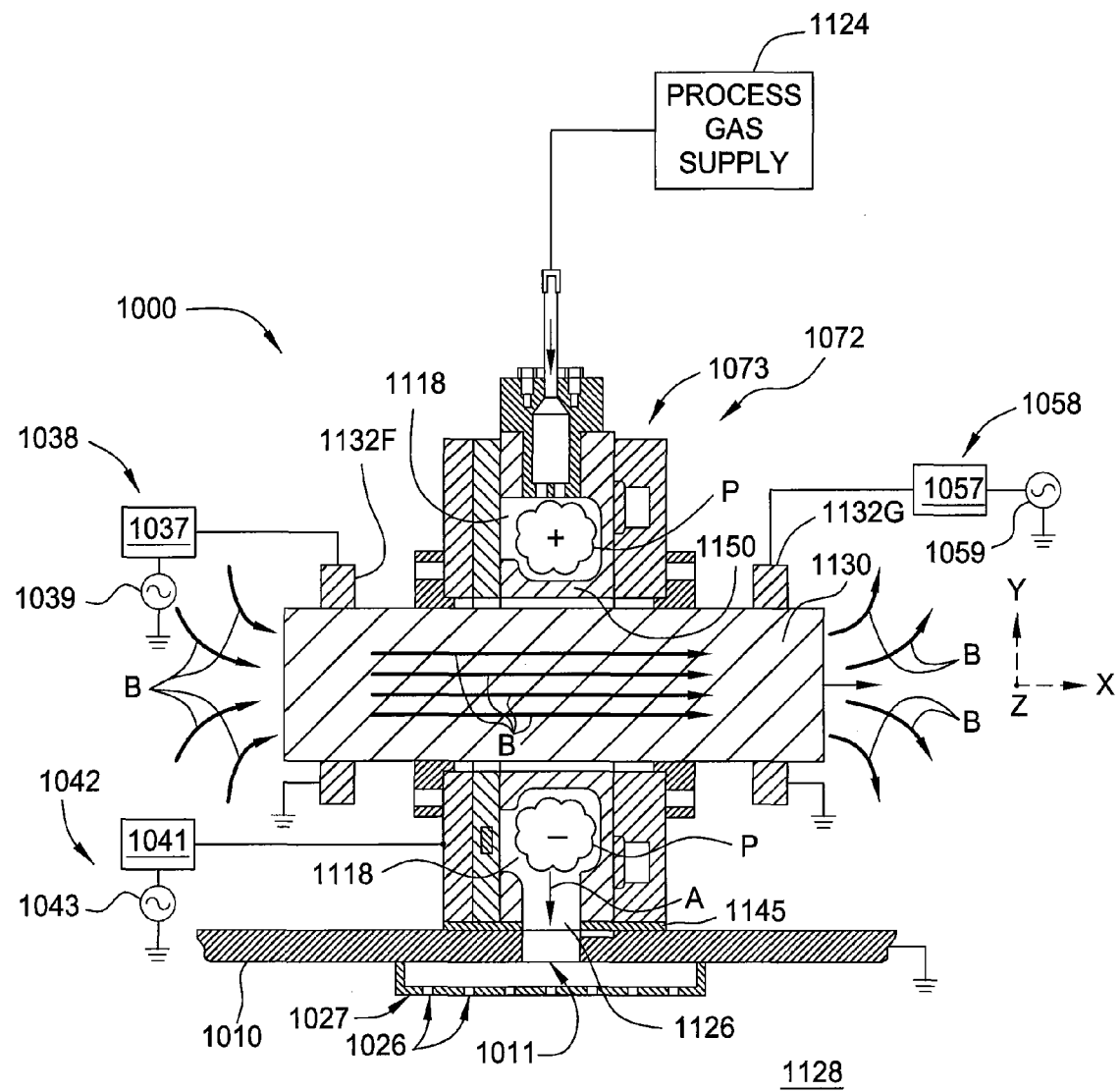
FIG. 2G is a side cross-sectional view of plasma source having two or more coils wound around a core element according to one embodiment of the present invention.

While FIG. 2B illustrates only a single inductive coil 1132 positioned outside the torroidal plasma source, this configuration is not intended to limit the scope of the present invention, since the number and location of coils 1132 may vary depending upon the application or desirability of plasma ion density. In some embodiments, as schematically shown in FIG. 2G, the coil 1132 may be wound around an outer portion of the core element 1130 at either end, at a center portion of the core element 1130 (e.g., 1132B or 1132D FIG. 5), or evenly wrapped around the core element 1130 from one end to the other. In one embodiment, as shown in FIG. 2G, if multiple coils are used, each of the coils 1132F, 1132G may be separately connected to the respective RF power sources, such as source assemblies 1038 and 1058. The source assembly 1058 may comprise an RF power source 1059 and/or an impedance matching element 1057. The phase and power level of each of the RF power signals delivered to each of the RF coils 1132F, 1132G can be adjusted or configured relative to each other to improve the plasma uniformity in the plasma generating region 1118 and/or improve the RF power coupling.

Figure 2I:
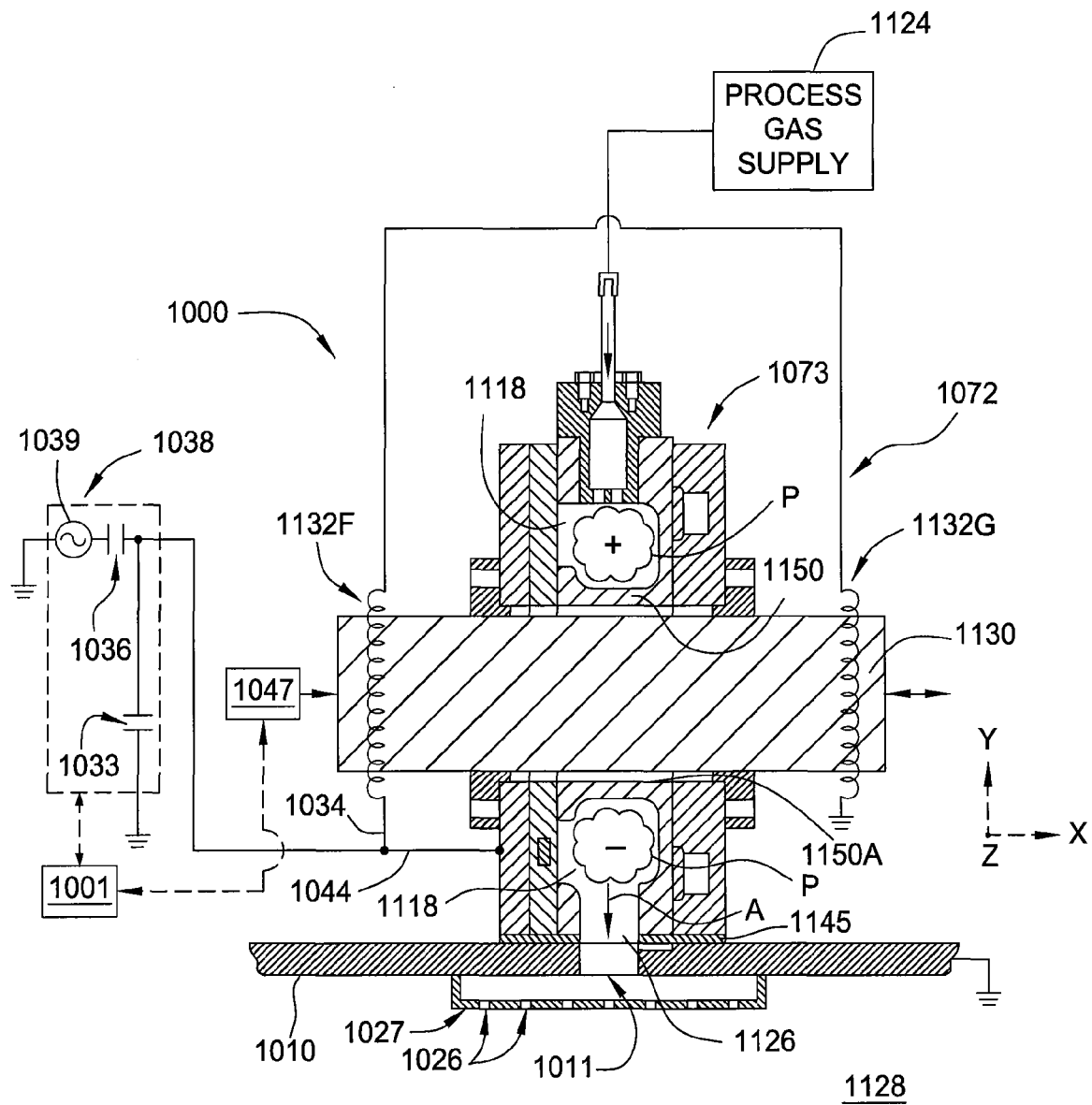
FIG. 2I is a schematic side cross-sectional view of a source assembly according to one embodiment of the present invention.
Figure 2J:
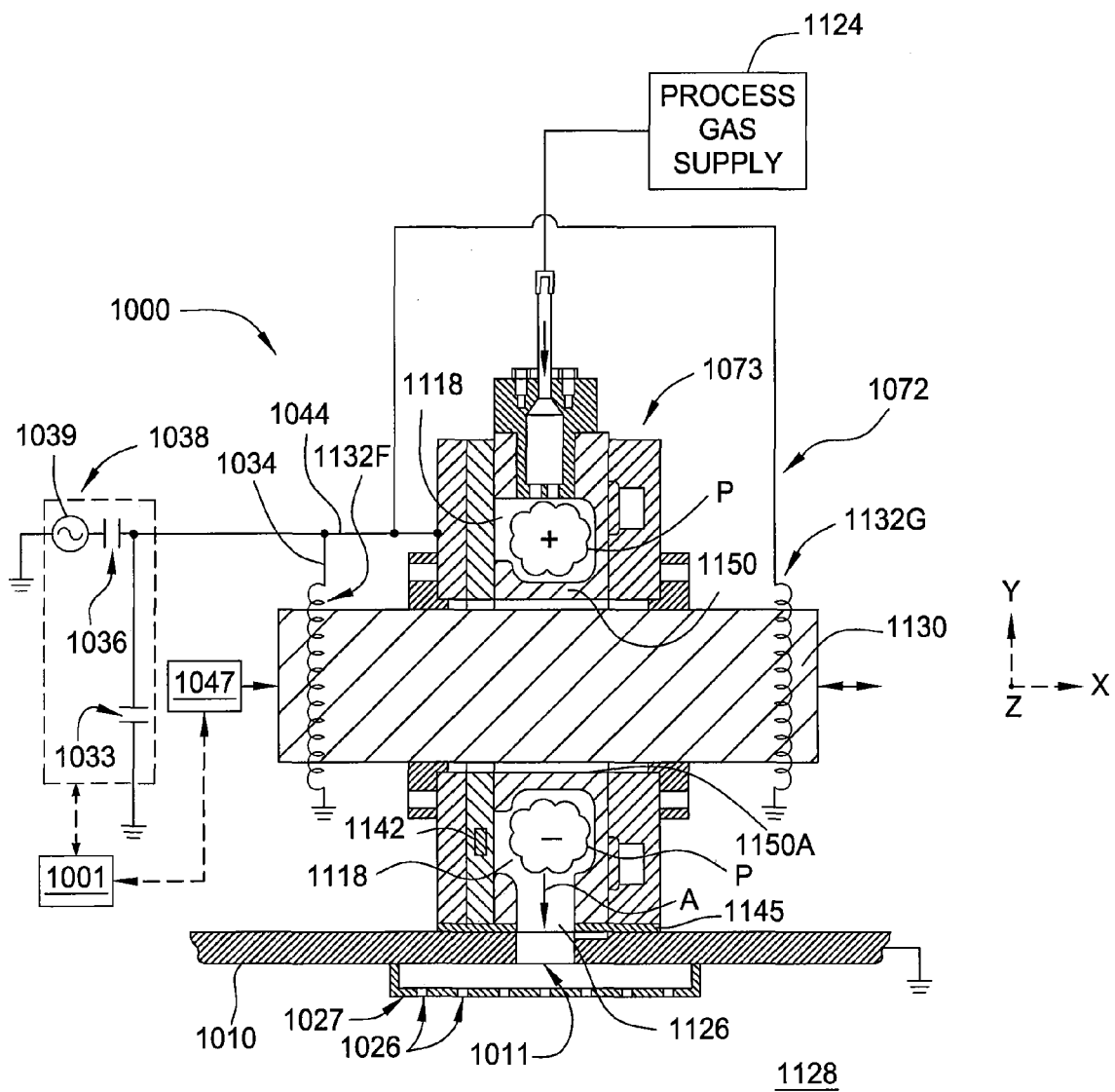
FIG. 2J is a schematic side cross-sectional view of a source assembly according to one embodiment of the present invention.

In some embodiments, the coil 1132 may comprise two or more coils (e.g., coils 1132F and 1132G) that are symmetrically positioned on the core element 1130, relative to the plasma generating region 1118, to form a uniform plasma in the plasma generating region 1118 in a direction parallel to the core element 1130 (i.e., X-direction). In one example, as schematically shown in FIG. 2I, two or more coils are connected in series to a source assembly 1038 and are wound around the core element 1130 on opposite sides of the plasma generating region 1118. It is believed that delivery of the source power to series connected coils has processing advantages. The processing advantages include the more symmetric and uniform generation of magnetic fields in the core element 1130 by coils that have a similar number of turns, since the same current flows through both series connected coils. The more symmetric and uniform generated fields in the core element 1130 are believed to improve the lateral uniformity of the plasma in the plasma generating region 1118 in a direction parallel to the core element 1130 (i.e., X-direction) and improve the coupling of the generated field(s) to the core element 1130. In another example, as schematically shown in FIG. 2J, two or more coils are connected in parallel to a source assembly 1038 and are wound around the core element 1130 on opposite sides of the plasma generating region 1118. In one configuration, the symmetrically positioned coils, such as coils 1132F and 1132G, are wound around the core element in the same direction. In some cases, while typically not preferred due to at least partial cancellation of the generated fields, the coils are wound around the core element 1130 in opposing directions. While the fixed electrical element type source assembly 1038 is illustrated in FIGS. 2I and 2J this source assembly configuration is not intended to be limiting as to the scope of the invention described herein.

Plasma Uniformity Adjustment

As schematically illustrated in FIG. 2D, due to the radial difference in the strength of the magnetic field formed by the delivery of RF energy through the core element 1130 the plasma formed in the plasma generating region 1118 will have a higher plasma density near the inner wall 1150 versus the outer wall 1156 of the plasma block 1116. Therefore, to further improve the plasma coupling and/or make the plasma uniformity within the plasma generating region 1118 more uniform various plasma adjusting techniques can be used.

Figure 3:
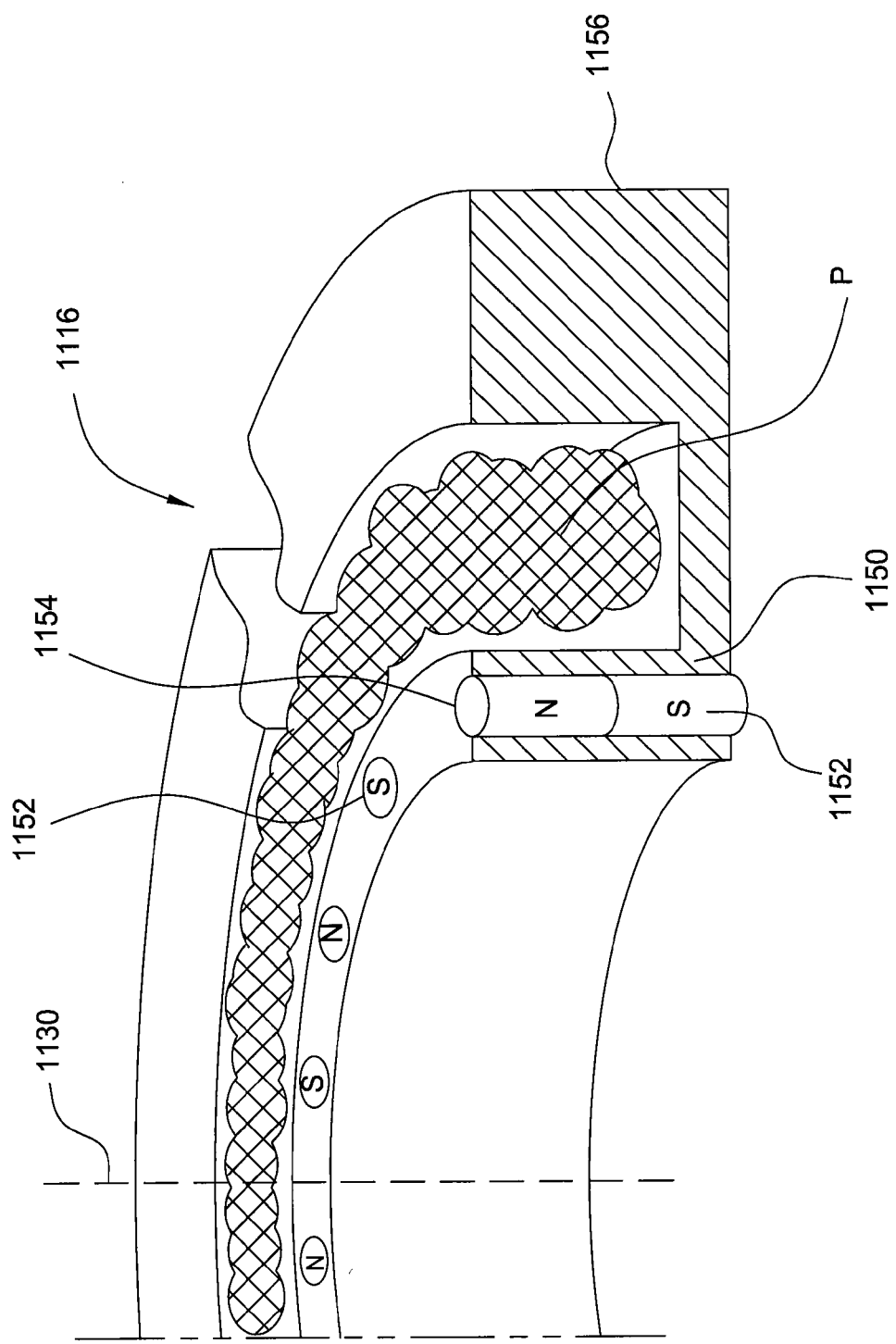
FIG. 3 is an isometric cross-sectional view of the plasma block according to one embodiment of the present invention.

In one embodiment of the plasma source 1000, as shown in FIG. 3, one or more field shaping elements, such as permanent magnets 1152, are positioned around the plasma generating region 1118 to adjust the plasma uniformity. FIG. 3 is a partial isometric cross-sectional view of the plasma block 1116 according to one embodiment of the present invention. In FIG. 3, the magnetically core element 1130, which is represented by dashed line, the cooling plate 1134 and the side cover 1140 have all been omitted for clarity. In one embodiment of the plasma controlling device 1072, multiple permanent magnets 1152 are embedded around the circumference of the inner wall 1150 of the plasma block 1116 to adjust the plasma formed in the plasma generating region 1118. In one aspect, the inner wall 1150 of the plasma block 1116 is provided with a plurality of openings 1154 that are configured to receive permanent magnets 1152 therein. The permanent magnets 1152 are generally spaced-apart in a symmetric pattern and are arranged with alternating polarities (i.e., alternating north "N" and south "S"). The permanent magnets 1152 disposed around the circumference of the inner wall 1150 will tend to "push" the plasma generated in the plasma generating region 1118 away from inner wall 1150 of the plasma block 1116 toward the middle of the circular region, or the outer wall 1156. The use of the field shaping elements thereby makes the plasma density more uniform through the plasma generating region 1118 formed between the inner wall 1150 and the outer wall 1156. The field shaping elements may comprise permanent magnets, electromagnets or other similar devices that are able to shape the generated fields and plasma formed in the plasma generation region 1118.

Figure 4:
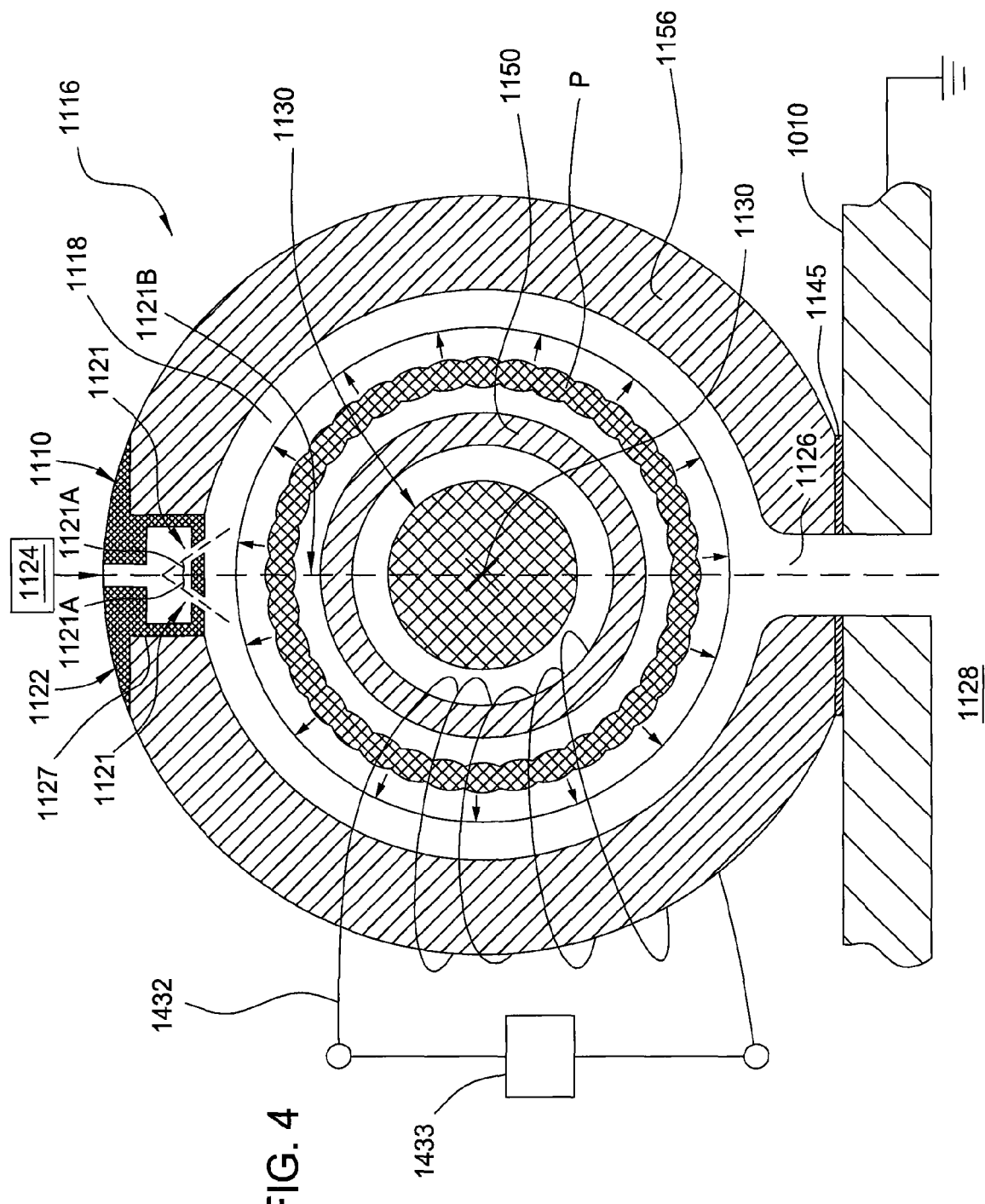
FIG. 4 is a side cross-section view of the plasma controlling device that has a coil wound around at least a portion of the plasma generation region according to one embodiment of the present invention.

In some cases, instead of using the field shaping elements, a coil is wound around at least a portion of the plasma block 1116 so that the fields generated by flowing a current through this wound coil 1432 will redistribute the plasma formed in the plasma generating region 1118. FIG. 4 is a side cross-section view of the plasma controlling device 1072 that schematically illustrates a wound coil configuration according to one embodiment of the present invention. In this embodiment, one or more coils 1432 are wrapped a desired number of turns around the plasma block 1116. In one embodiment, a coil 1432 is wound around all portions of the plasma block 1116, such as 360° around the inner wall 1150, side wall 1158 and outer wall 1156 of the plasma block 1116 and side cover 1140 to uniformly distribute the plasma formed in the plasma generating region 1118 when a current is passed through the coil 1432 by the power source 1433. In one embodiment, a DC power is delivered to the coils 1432 to inductively couple and redistribute the plasma generated in the plasma generating region 1118. More specifically, the magnetic field created by the current passing through the coil. 1432 will generally have a magnetic flux density that is strongest near the center of the inner wall 1150, which will tend to pull the plasma away from the edge of inner wall 1150 and redistribute it towards the middle of the plasma generating region 1118, as represented by arrows. The delivery of the current through the coil 1432 will thus tend to make the plasma density more uniform in the plasma generating region 1118. In one embodiment, the inductive coil 1432 is used to ignite the plasma formed in the plasma generating region 1118 by use of a power source 1433 that is able to deliver RF energy. If more than one coil 1432 is used, each of the coils 1432 may be driven using the same power and frequencies, or each coil 1432 may be independently driven at different powers and/or frequencies.

It is also contemplated that the coils 1432 may be wrapped around the inner and outer walls 1150, 1156 at any desired locations, or evenly wrap around the inner and outer walls 1150, 1156 at desired intervals. In one embodiment, the coil 1432 is wrapped around the outer portion of the core element 1130 and adjacent to the cooling plate 1134. In one aspect, the coil 1432 is arranged between the cooling plate 1134 and a supporting element 1135. The supporting element 1135 is coupled to a side of the cooling plate 1134 and may include one or more support plates (e.g., the support plates 1136, 1137 shown in FIG. 2B) to fasten the core element 1130 extending the support plates 1136 and 1137. In one configuration, as illustrated in FIG. 4, a coil 1432 is shown as being wound in-phase, that is, current flowing through the coil 1432 induces the plasma to flow around the plasma generating region 1118 in the same direction. Alternatively, the coils 1432 could be wound out-of-phase to each other.

In some configurations of the plasma source 1000, the only the inner surfaces that contact the plasma generating region 1118 of the plasma block 1116 may be made of an electric insulator, such as fused silica or ceramic that will not react with plasma chemistry. Therefore, in some configurations, the plasma block could be made primarily from a metal, such as dielectric coated aluminum, anodized aluminum or stainless steel. In configurations where the portions of the plasma block 1116, such as the inner wall 1150, side wall 1158 and/or outer wall 1156 are formed from an electrically conductive material (e.g., metal), an insulating spacer (not shown), or dielectric break, needs to be provided to break and suppress eddy currents that generally flow in the walls 1150, 1156, 1158 due to the fields generated by the delivery of current to the coil 1432. The addition of insulating spacer between the conductive walls will generally make the plasma source 1000 assembly more complex and costly, while also making it harder to assemble in a vacuum tight configuration. The insulating spacer(s) can thus be omitted if the inner or outer walls 1150, 1156 and side wall 1158 are made of an insulating or non-conductive material.

Gas Delivery Hardware

As noted above, during plasma processing, a processing gas is delivered into the plasma generating region 1118 from a gas supply 1124 through the inlet port 1127 (FIG. 2B) of the plasma block 1116 and the excited gas atoms exit the plasma generating region 1118 through an outlet port 1126 that is also formed in the plasma block 1116. In one embodiment, a dome portion 1110 of the plasma controlling device 1072 is used to deliver the processing gas(es) to the inlet port 1127 of the plasma block 1116 and plasma generating region 1118 formed therein. In one embodiment, the dome portion 1110 generally includes a gas inlet 1120 and a gas diffuser body 1122. The gas diffuser body 1122 generally extends through the inlet port 1127 in the outer wall 1156 of the plasma block 1116. The gas inlet 1120 is connected to an external gas source(es), for example, a process gas supply 1124, to introduce a process or clean gas(es) into the plasma controlling device 1072. In one embodiment, the dome portion 1110 comprises a gas distribution plenum 1123, which is formed within the gas diffuser body 1122, and used to redistribute and control the gas delivery into the plasma generating region 1118 through holes 1121 formed in gas diffuser body 1122. The outer wall 1156 of the plasma block 1116 is provided with a gas/plasma outlet port 1126, which leads to a processing region 1128 in the plasma source 1000. Therefore, the gas distribution plenum 1123 and the plasma generating region 1118 are in fluid communication.

The process or cleaning gases may include oxygen-containing or nitrogen-containing gases such as $NH_3$, $N_2O$, NO, $NO_2$, $O_2$, or fluorine-containing gases such as $F_2$, $NF_3$, $NH_4F$, $CF_4$, $C_3F_8$, $SF_6$, or $C_2F_5H$, and combinations thereof, and optionally, carrier gases, such as argon, helium or nitrogen. In one aspect, the process gas comprises essentially argon (Ar). In another aspect, the process gas comprises essentially ammonia ($NH_3$). In another aspect, an ammonia ($NH_3$) and nitrogen trifluoride ($NF_3$) gases are introduced into the plasma controlling device 1072 to generate the $NH_4F$ plasma, which then may be used to remove native oxides on the substrate placed in the plasma source 1000. It is contemplated that other processing precursor gases, such as TSA, silane, TEOS or other useful precursor gases may be used depending upon the application. The precursor gas may be provided at a flow rate between about 100 sccm and about 1000 sccm. During processing the pressure in the processing region 1128 in the plasma source 1000 may be maintained between about 100 mTorr and about 20 Torr. In one example, the pressure of the chamber is maintained between about 100 mTorr and about 1.25 Torr.

Referring to FIG. 4, the plurality of gas openings, or holes 1121, may be formed at one or more angles 1121A relative to the central axis 1121B of the gas diffuser body 1122, thereby allowing the process or cleaning gas to be delivered into the plasma generating region 1118 in a tangential manner to form a circular type vortex-flow pattern, rather than causing the flowing gas to impinge on the interior surface of the inner wall 1150 after entry into the plasma generating region 1118. In one example, the holes 1121 formed at an angle relative to a radial direction of the plasma generating region 1118, such as the central axis 1121B shown in FIG. 4, which bisects the gas diffuser body 1122 and extends through the core element central axis 1130S. In one embodiment, the predetermined angle may be ranging from about 20° to about 70°, such as about 45°. Each opening of the plurality of openings may have a desired width and length, depending upon the application. The gas diffuser body 1122 may contain a desired number of openings, for example, about 10 openings or more, such as about 20 openings or more.

Multiple Plasma Source Configuration

Figure 5:
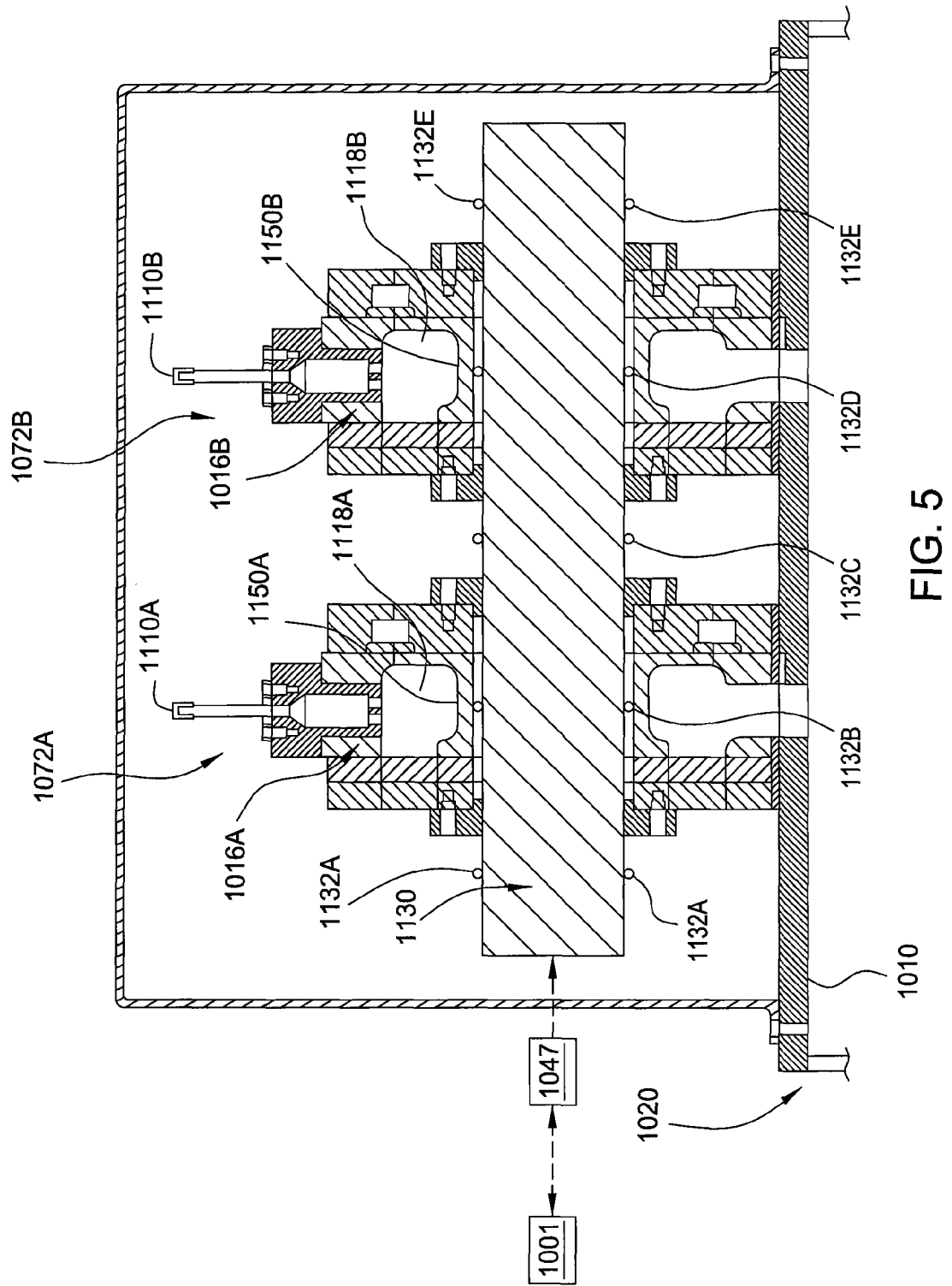
FIG. 5 illustrates a schematic cross-sectional view of a plasma chamber having two plasma controlling device coupled to process chamber according to one embodiment of the present invention.

In some processing configurations multiple plasma sources can be used in parallel so that process gases that have similar or different compositions can be delivered to each plasma source to provide energetic gas atoms that have varying mixture ratios and/or energies to the processing region 1128 of the process chamber 1020. FIG. 5 illustrates a simplified cross-sectional view of a plasma chamber having two plasma controlling devices 1072A, 1072B that are coupled to the chamber lid 1010 of the process chamber 1020 according to one embodiment of the present invention. For ease of illustration, the plasma chamber components have been omitted, however, it is contemplated that the process chamber 1020 contains all of the same components as the process chamber shown in FIG. 2B except the chamber is adapted receive two plasma controlling devices 1072A, 1072B. In this embodiment, two plasma controlling devices 1072A, 1072B are attached or mounted on the chamber lid 1010 of the process chamber 1020 to produce and introduce the gas radicals and/or ionized gas(es) into the downstream process chamber 1020 through a showerhead assembly 1027. The two plasma controlling devices 1072A, 1072B are arranged in parallel and share a common core element 1130 that is disposed through the inner walls 1150A, 1150B of the plasma blocks 1016A, 1016B. The core element 1130 in this configuration is generally similar to the component discussed above, except that it may require some added length to allow it to service both of the plasma controlling devices 1072A and 1072B. In some embodiments of the invention, the two or more plasma generating regions, for example plasma generating regions 1118A and 1118B, are all formed in a single plasma block (not shown), such as plasma block 1016A, to reduce the number of duplicated components and improve the ability to align the two or more plasma generating regions to the core element 1130.

As illustrated in FIG. 5, a coil 1132A may be wound around an outer portion of the core element 1130. The number of turns of the coil 1132A may vary, ranging from about 1 turn to about 10 turns. In some case the coil 1132A may have 10 or more turns. The coil 1132A may be arranged at different locations along the core element 1130. In one embodiment, the coil 1132A may comprise multiple coils that are distributed in different locations. In one embodiment, the coil is distributed in any of following manners: (1) at coil locations 1132A and 1132E; (2) at coil locations 1132B and 1132D; (3) at coil location 1132C only; (4) at coil locations 1132A and 1132C or 1132C and 1132E; and (5) at coil locations 1132A, 1132B, 1132C, 1132D, and 1132E, depending upon the application or desirability of plasma ion density. It is also contemplated that when multiple coils are used, the coils may be separately connected to the respective RF power sources assemblies (e.g., 1038, 1058 in FIG. 2G). The RF power signals delivered to each of the RF coils can be adjusted or configured relative to each other to achieve a desirable plasma uniformity, gas radical energies or plasma ion distribution. Similarly, the uniformity of the generated plasma may vary as the process conditions are varied (e.g., power, pressure, gas flow rate, gas composition), the way the plasma controlling devices are positioned, the position of the substrate in the plasma and/or the inherent physical characteristics of the plasma controlling device. In one embodiment, to further improve the coupling of the delivered RF energy to the plasma generating regions 1118A, 1118B of the two plasma controlling devices 1072A, 1072B an actuator 1047 and system controller 1001 are used to adjust and tune the position of the core element 1130 relative to the plasma generating regions 1118A, 1118B to improve the RF coupling to the gas disposed therein. In some configurations, the position of the core element 1130 relative to the first plasma controlling device 1072A is controlled and the position of the core element 1130 relative to second plasma controlling device 1072A is of secondary importance (i.e., slave).

In one aspect, the gas inlets 1110A, 1110B of the plasma controlling devices 1072A, 1072B may be connected respectively to the same or different external gas sources (not shown) to provide different process or cleaning gases to the plasma controlling devices 1072A, 1072B, depending upon the application. The dual plasma controlling device configuration enables fast switching of different plasmas, which may be advantageous in certain applications such as PEALD (Plasma Enhanced ALD) or CVD applications using remote plasma source for deposition or clean regimes. The dual plasma controlling device configuration, is also useful to allow the simultaneous delivery of energetic gas species from incompatible gases that cannot be desirably excited in a single plasma controlling device.

Figure 6A:
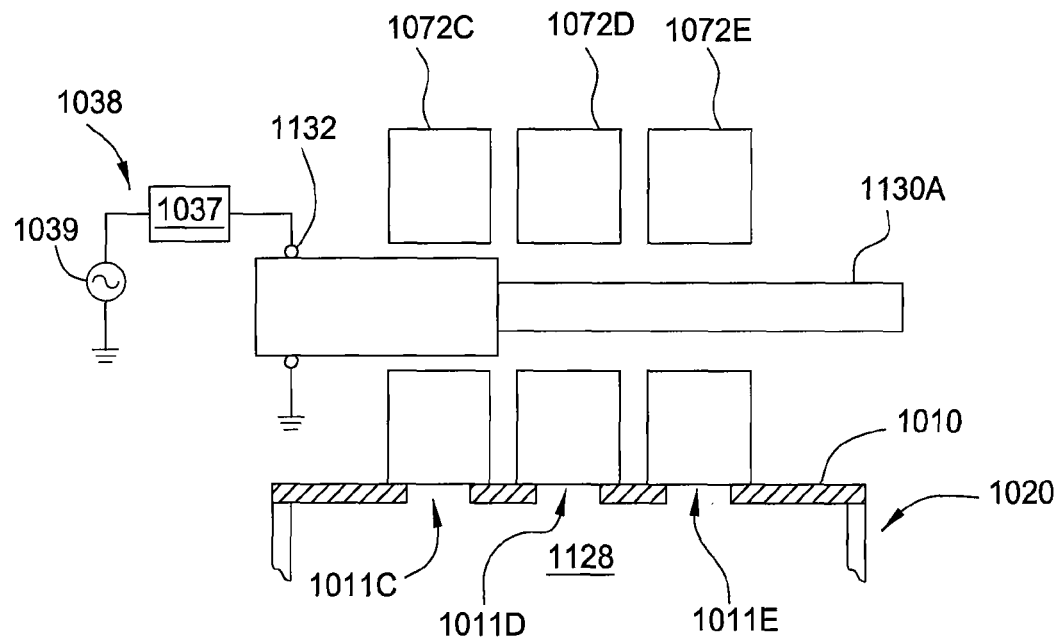
FIGS. 6A and 6B are schematic cross-sectional views of a plasma chamber having at least three plasma controlling devices coupled to a process chamber according to another embodiment of the present invention.
Figure 6B:
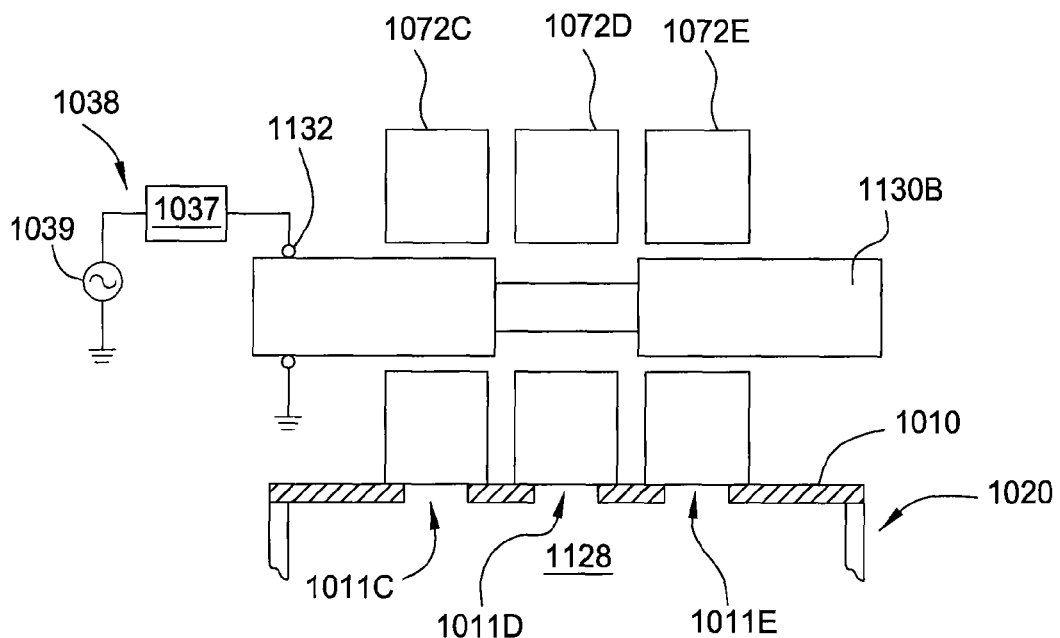

FIGS. 6A and 6B are schematic diagrams illustrating a cross-sectional view of a plasma source 1000 that has three plasma controlling devices (e.g., reference numerals 1072C, 1072D and 1072E) that are coupled to a core element (e.g., reference numerals 1130A, 1130B) according to one embodiment of the present invention. For ease of illustration, the process chamber 1020 components have been omitted, and the plasma controlling devices 1072C, 1072D and 1072E and magnetically permeable core element 1130A, 1130B are only schematically illustrated in FIGS. 6A and 6B. However, each of these components may include the hardware components described above in conjunction with FIGS. 2A-2G and FIG. 5. In one example, each of the plasma controlling devices 1072C, 1072D and 1072E shown in FIG. 6A or 6B contain all of the same components as those discussed above in conjunction with FIG. 2B. Similar to FIG. 5, the three plasma controlling devices 1072C, 1072D and 1072E are arranged in parallel and share a common core element 1130A, 1130B that is disposed through the inner rings of the plasma blocks (not shown) and extending through opposing sides of each of the plasma controlling devices 1072C, 1072D and 1072E.

In one configuration, a coil 1132 is wound around an outer portion of the core element 1130A (FIG. 6A) or 1130B (FIG.

6B). Similarly, the number of turns and location of the coil may be adjusted in a manner similar to discussion found in conjunction with FIG. 5, depending upon the application or desirability of plasma ion density. The gas inlets (not shown) found in each of the plasma controlling devices 1072C, 1072D and 1072E may be connected respectively to the same or different external gas sources (not shown), thereby enabling the fast switching of the process gasses to form plasmas having the same or different compositions to form desirable gas radicals or gas ions, as discussed above.

In one embodiment of the plasma source 1000, three plasma controlling devices 1072C, 1072D and 1072E share a common core element (e.g., reference numeral 1130A or 1130B) having a varying diameter at different portions of the core element. For example, in FIG. 6A, the diameter of the core element 1130A, which extends through the first plasma controlling device 1072C (i.e., the leftmost or outmost one) may be larger than the region of the core element 1130A that extends through the second and third plasma controlling devices 1072D and 1072E. Alternatively, as shown in FIG. 6B, the diameter of the core element 1130B that extends through the second plasma controlling device 1072D (i.e., the middle one) may be smaller than that of the portions of the core element 1130B that extend through the first and third plasma controlling devices 1072C and 1072E. Since the distance between the outer surface of the core element and the plasma generating region will affect the plasma coupling efficiency of the generated RF fields to the plasma, varying the diameter of the core element relative to similarly configured plasma blocks will cause the coupling efficiency and plasma density in each of the plasma sources to differ. The differing plasma characteristics created in each of the plasma generating regions found in each of the plasma controlling devices 1072C, 1072D and 1072E, due to the difference in core element diameter, or the shape or diameter of the plasma generating region formed in the plasma block, the plasma properties in each of the plasma controlling devices 1072C, 1072D and 1072E can be optimized for a specific type of process gas, or process gas mixture, delivered to each plasma controlling device. Depending on the diameter of the core element, or relative distance that the outer surface of the core element is positioned from the plasma generating region, a different energy may be coupled into the plasma cavities.

The differing plasma characteristics created in each of the plasma generating regions due to hardware configuration, gas composition, and/or gas flow rate differences in the plasma controlling devices 1072C, 1072D and 1072E, can thus be used to generate and deliver gas radicals and/or gas ions having differing characteristics to the process region 1128 of the process chamber 1020 through the openings 1011C, 1011D, and 1011E in the chamber lid 1010.

While the foregoing is directed to embodiments of the present invention, other and further embodiments of the invention may be devised without departing from the basic scope thereof, and the scope thereof is determined by the claims that follow.

What is claimed is:

1. A plasma source coupled to a processing chamber, comprising:
    a core element having a first end, a second end and a core element central axis;
    a plasma block having one or more surfaces that at least partially enclose a first annular shaped plasma generating region, wherein the core element is extended through opposing sides of the plasma block and the first annular shaped plasma generating region is disposed around a first portion of the core element;
    a first coil disposed over a first portion of the core element; and
    a second coil disposed over a second portion of the core element, wherein the plasma block is disposed between the first portion of the core element and second portion of the core element.

2. The plasma source of claim of claim 1, wherein the first coil and second coil are connected in series to an RF power source.

3. The plasma source of claim of claim 1, wherein the first coil and second coil are connected in parallel to an RF power source.

4. The plasma source of claim of claim 1, wherein the first coil and second coil are wound around the core element in the same direction.

5. The plasma source of claim of claim 1, wherein the plasma block is symmetrically positioned between the first coil and the second coil.

* * * * *

UNITED STATES PATENT AND TRADEMARK OFFICE
CERTIFICATE OF CORRECTION

PATENT NO.        : 8,771,538 B2                                          Page 1 of 1
APPLICATION NO.   : 12/949661
DATED             : July 8, 2014
INVENTOR(S)       : Lubomirsky et al.

It is certified that error appears in the above-identified patent and that said Letters Patent is hereby corrected as shown below:

On the Title Page, Item [75]:

Please insert --L.-- after Matthew;

Please delete "San Jose, NM" and insert --San Jose, CA-- therefor;

In the Specification:

Column 8, Line 43, please delete "Ipm" and insert --lpm-- therefor.

Signed and Sealed this
Eleventh Day of November, 2014

Michelle K. Lee
*Deputy Director of the United States Patent and Trademark Office*